US012513989B2

(12) United States Patent
Jang et al.

(10) Patent No.: US 12,513,989 B2
(45) Date of Patent: Dec. 30, 2025

(54) DISPLAY DEVICE, METHOD OF MANUFACTURING THE SAME, AND TILED DISPLAY DEVICE HAVING THE SAME

(71) Applicant: Samsung Display Co., LTD., Yongin-si (KR)

(72) Inventors: Dae Hwan Jang, Seoul (KR); Seok Hyun Nam, Seoul (KR); Jin Ho Cho, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 492 days.

(21) Appl. No.: 17/973,814

(22) Filed: Oct. 26, 2022

(65) Prior Publication Data
US 2023/0282650 A1 Sep. 7, 2023

(30) Foreign Application Priority Data
Mar. 3, 2022 (KR) .................. 10-2022-0027551

(51) Int. Cl.
*H10D 86/60* (2025.01)
*H01L 23/00* (2006.01)
(Continued)

(52) U.S. Cl.
CPC ............ *H10D 86/60* (2025.01); *H01L 24/05* (2013.01); *H01L 25/167* (2013.01);
(Continued)

(58) Field of Classification Search
CPC .. H10D 86/60; H10D 86/0231; H10D 86/441; H10H 20/83; H01L 24/05; H01L 25/167; H01L 24/08; H01L 2224/05557; H01L 2224/05647; H01L 2224/05582; H01L 2224/05666; H01L 2224/0807; H01L 2224/08155; H10K 59/38; H10K 50/865; H10K 59/122
See application file for complete search history.

(56) References Cited

U.S. PATENT DOCUMENTS 10,811,482 B2   10/2020 Kim et al.
2016/0336540 A1*   11/2016 Li .................. H10K 71/60
(Continued)

FOREIGN PATENT DOCUMENTS

CN   106601781 B   * 12/2019   ......... H10K 50/8426
JP   2005346091 A   * 12/2005   ............. G02F 1/136
(Continued)

*Primary Examiner* — Fatima N Farokhrooz
(74) *Attorney, Agent, or Firm* — Womble Bond Dickinson (US) LLP

(57) ABSTRACT

A display device comprises a substrate comprising a first contact hole, a barrier insulating layer disposed on the substrate and comprising a second contact hole, a fan-out line disposed in a first metal layer on the barrier insulating layer and comprising a pad part inserted into the second contact hole, a display layer disposed on the fan-out line, and a flexible film disposed below the substrate and having a lead electrode which is inserted into the first contact hole and bonded to the pad part. The pad part comprises a first base, a first protrusion integral with the first base and protruding from the first base, and a second protrusion protruding from the first protrusion.

13 Claims, 17 Drawing Sheets

(51) Int. Cl.
  *H01L 25/16*  (2023.01)
  *H10D 86/01*  (2025.01)
  *H10D 86/40*  (2025.01)
  *H10H 20/83*  (2025.01)

(52) U.S. Cl.
  CPC ....... *H10D 86/0231* (2025.01); *H10D 86/441* (2025.01); *H10H 20/83* (2025.01); *H01L 24/08* (2013.01); *H01L 2224/05557* (2013.01); *H01L 2224/05582* (2013.01); *H01L 2224/05647* (2013.01); *H01L 2224/05666* (2013.01); *H01L 2224/0807* (2013.01); *H01L 2224/08155* (2013.01)

(56) References Cited

U.S. PATENT DOCUMENTS

| | | | | |
|---|---|---|---|---|
| 2018/0012549 | A1* | 1/2018 | Lee | G09G 3/3266 |
| 2021/0366891 | A1* | 11/2021 | Hong | H05K 1/113 |
| 2022/0013576 | A1 | 1/2022 | Cho et al. | |

FOREIGN PATENT DOCUMENTS

| | | |
|---|---|---|
| JP | 6807712 | 1/2021 |
| KR | 10-0685833 | 2/2007 |
| KR | 10-2018-0000046 | 1/2018 |
| KR | 10-2018-0049418 A | 5/2018 |
| KR | 10-2022-0007754 A | 1/2022 |

\* cited by examiner

DISPLAY DEVICE, METHOD OF MANUFACTURING THE SAME, AND TILED DISPLAY DEVICE HAVING THE SAME

CROSS-REFERENCE TO RELATED APPLICATION

This application claims priority to and benefits of Korean Patent Application No. 10-2022-0027551 under 35 U.S.C. § 119, filed on Mar. 3, 2022, in the Korean Intellectual Property Office (KIPO), the entire contents of which are incorporated herein by reference.

BACKGROUND

1. Technical Field

The disclosure relates to a display device, a method of manufacturing the same, and a tiled display device having the same.

2. Description of the Related Art

With the advancement of the information society, the demand for display devices for displaying images is increasing in various forms. For example, display devices are being applied to various electronic devices such as smartphones, digital cameras, notebook computers, navigation devices, and smart televisions. Examples of the display devices include flat panel display devices such as a liquid crystal display (LCD) device, a field emission display (FED) device, an organic light emitting display device, and the like. Of the flat panel display devices, a light emitting display device includes a light emitting element that enables each pixel of a display panel to emit light by itself. Thus, the light emitting display device can display an image without a backlight unit that provides light to the display panel.

For a display device having a large screen, a great amount of pixels are disposed on the screen, and thus the defect rate of light-emitting elements may increase while productivity or reliability may deteriorate. To overcome such issues, a tiled display can provide a large screen by connecting display devices having a relatively small size. Such a tiled display may include boundaries between the display devices that are referred to as seams because there are non-display areas or bezel areas between the display devices adjacent to each other. When a single image is displayed on the full screen, such boundaries between the display devices result in visible seams, hindering a viewer from getting immersed into the image and thereby causing a problem in that a not-so-realistic image is provided to the user.

SUMMARY

Aspects of the disclosure provide a display device which improves conductivity and bonding strength between a pad part and a lead electrode, a method of manufacturing the same, and a tiled display device having the same.

Aspects of the disclosure provide a display device that eliminates visible seams between a plurality of display devices by way of preventing the boundaries or non-display areas between the display devices from being recognized, allowing a viewer to get immersed in displayed images without being hindered by unsightly boundaries between portions of an image, a method of manufacturing the same, and a tiled display device having the same.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device comprises a substrate comprising a first contact hole, a barrier insulating layer disposed on the substrate and comprising a second contact hole, a fan-out line disposed in (or included in) a first metal layer on the barrier insulating layer and comprising a pad part inserted into the second contact hole, a display layer disposed on the fan-out line, and a flexible film disposed below the substrate and having a lead electrode which is inserted into the first contact hole and bonded to the pad part. The pad part comprises a first base, a first protrusion integral with the first base and protruding from the first base, and a second protrusion protruding from the first protrusion.

The lead electrode may comprise a second base, and a protrusion integral with the second base and protruding from the second base.

Side surfaces of the protrusion of the lead electrode may contact a side surface of each of the first and second protrusions of the pad part.

A lower surface of the second protrusion may face the second base and an upper surface of the protrusion may face the first base.

The pad part may comprise first protrusions, the first protrusions may extend in a first direction and may be spaced apart from each other in a second direction that intersects the first direction, and the protrusion may be inserted into a space between the first protrusions.

A height of an upper surface of the protrusion may be greater than a height of a lower surface of the barrier insulating layer.

The first protrusion may comprise copper (CU) and the second protrusion comprises titanium (Ti).

The display device may further comprise a display driver mounted on the flexible film to provide a data voltage, a power source voltage, or a gate signal.

The display layer may comprise a connection line disposed in a second metal layer on the first metal layer, and a thin film transistor disposed in an active layer and a third metal layer on the second metal layer.

The flexible film may provide a data voltage, a power source voltage, or a gate signal to the thin film transistor through the lead electrode, the pad part, the fan-out line, and the connection line.

The display layer may further comprise a voltage line disposed in the second metal layer and electrically connected to the thin film transistor, and a connection electrode disposed in a fourth metal layer on the third metal layer. One end of the connection electrode may be electrically connected to the voltage line and another end of the connection electrode may be electrically connected to the thin film transistor.

The display layer may further comprise a light emitting element layer disposed on the fourth metal layer. The light emitting element layer may comprise a first electrode electrically connected to the connection electrode, a second electrode, the second electrode and the first electrode being disposed on a same layer, and a light emitting element aligned between the first electrode and the second electrode.

According to an embodiment of the disclosure, a method of manufacturing a display device comprises preparing a substrate, preparing a barrier insulating layer which is disposed on the substrate and comprises a first contact hole, forming a fan-out line which is disposed on the barrier insulating layer and comprises a pad part inserted into the first contact hole, forming a display layer on the fan-out line, forming a second contact hole which penetrates the substrate from a lower portion of the substrate, forming a first base, first protrusions protruding from the first base, and second protrusions protruding from the first protrusions by patterning a pad part exposed by the second contact hole, and bonding a lead electrode of a flexible film disposed below the substrate to the pad part by inserting the lead electrode into the second contact hole.

The forming of the first base, the first protrusions, and the second protrusions may comprise spraying an imprint resin onto a surface of the pad part, imprinting a shape of the imprint resin with a stamp, and patterning a portion of the pad part that is not covered by the imprint resin.

The lead electrode may comprise a second base, and a protrusion integral with the second base and protruding from the second base.

The bonding of the lead electrode to the pad part may comprise inserting the protrusion into a space between the first protrusions.

The bonding of the lead electrode to the pad part may comprise bonding each side surface of the protrusion to a side surface of each of the first and second protrusions.

The bonding of the lead electrode to the pad part may comprise causing a lower surface of the second protrusions and the second base to face each other and causing an upper surface of the protrusion and the first base to face each other.

The bonding of the lead electrode to the pad part may comprise bonding the lead electrode and the pad part to each other with metal diffusion by thermocompression bonding or ultrasonic bonding.

According to an embodiment of the disclosure, a tiled display device comprises a plurality of display devices each of which comprises a display area having a plurality of pixels and a non-display area surrounding the display area, and a coupling member that connects the plurality of display devices to each other. Each of the plurality of display devices comprises a substrate comprising a first contact hole, a barrier insulating layer disposed on the substrate and comprising a second contact hole, a fan-out line disposed on a first metal layer on the barrier insulating layer and comprising a pad part inserted into the second contact hole, a display layer disposed on the fan-out line, and a flexible film disposed below the substrate and having a lead electrode which is inserted into the first contact hole and bonded to the pad part. The pad part comprises a first base, a first protrusion integral with the first base and protruding from the first base, and a second protrusion protruding from the first protrusion.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail exemplary embodiments thereof with reference to the attached drawings, in which.

DETAILED DESCRIPTION OF THE EMBODIMENTS

Figure 1:
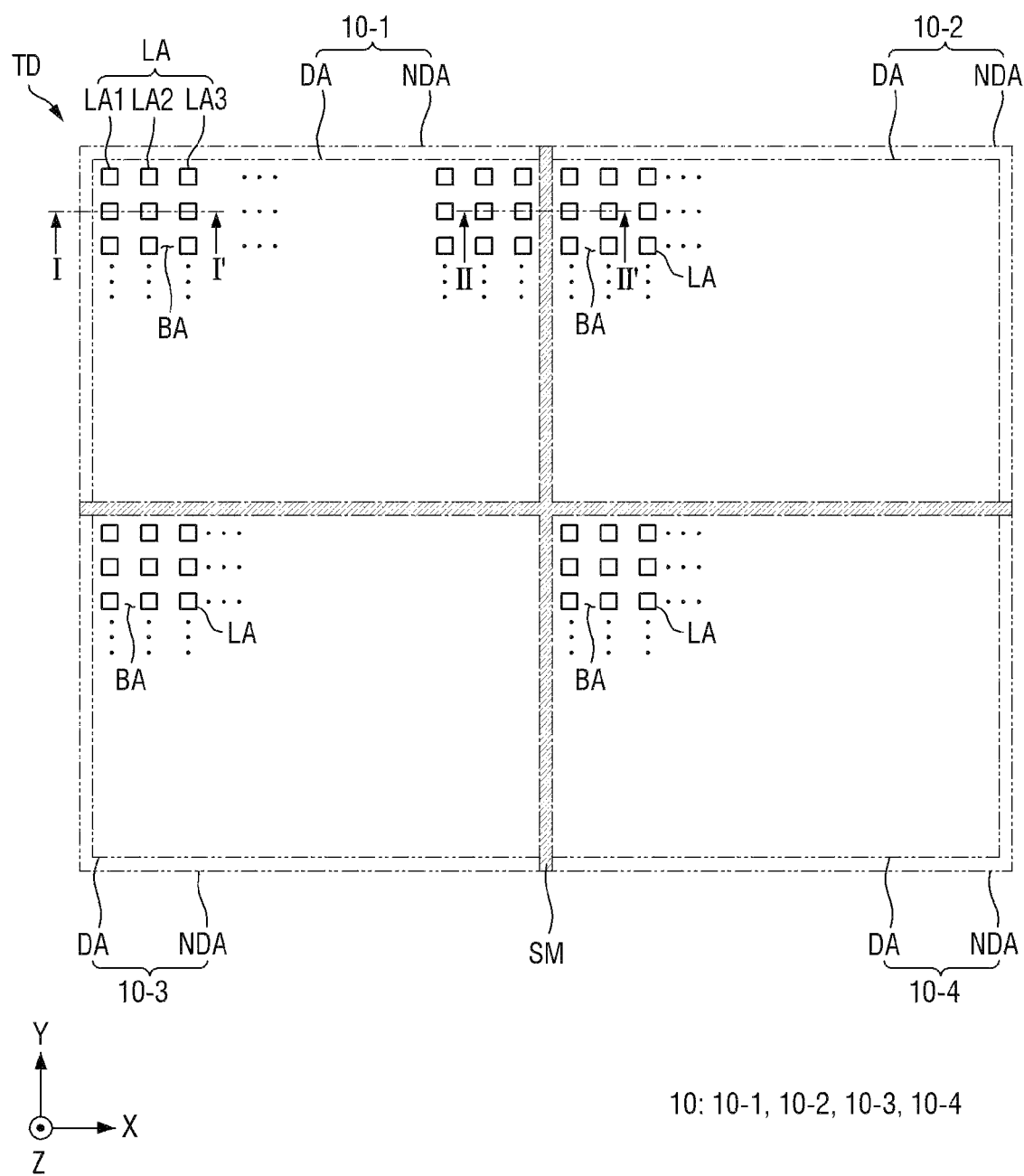
FIG. 1 is a schematic plan view showing a tiled display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "on," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the disclosure will be described with reference to the accompanying drawings.

FIG. 1 is a schematic plan view showing a tiled display device according to an embodiment.

Referring to FIG. 1, a tiled display device TD may include display devices 10. The display devices 10 may be arranged in, but is not limited to, a lattice pattern. The display devices 10 may be connected in a first direction (X-axis direction) or a second direction (Y-axis direction), and the tiled display device TD may have a certain shape. For example, the display devices 10 may all have the same size. It is, however, to be understood that the embodiment described herein is not limited thereto. For another example, the display devices 10 may have different sizes.

The tiled display device TD may include first to fourth display devices 10-1 to 10-4. The number and coupling relationship of the display devices 10 are not limited by the embodiment of FIG. 1. The number of the display devices 10 may be determined depending on the sizes of the display devices 10 and the tiled display device TD.

Each of the display devices 10 may have a rectangular shape including longer sides and shorter sides. The display devices 10 may be arranged such that their longer sides are connected with one another. Some of the display devices 10 may be disposed on an edge of the tiled display device TD to form a side of the tiled display device TD. Others of the display devices 10 may be disposed at a corner of the tiled display device TD, and may form two adjacent sides of the tiled display device TD. The others of the display devices 10 may be disposed on the inner side of the tiled display device TD and may be surrounded by the other display devices 10.

Each of the display devices 10 may include a display area DA and a non-display area NDA. The display area DA may include pixels to display images. Each of the pixels may include an organic light-emitting diode (LED) including an organic emissive layer, a quantum dot LED including a quantum dot emissive layer, a micro LED, or an inorganic LED including an inorganic semiconductor. In the following description, each of the pixels includes an inorganic LED, but the disclosure is not limited thereto. The non-display area NDA may be disposed around the display area DA to surround the display area DA, and may not display an image.

Each of the display devices 10 may include pixels arranged in rows and columns in the display area DA. Each of the pixels may include a light-emitting area LA defined by a pixel-defining layer or a bank, and may emit light having a peak wavelength through the light-emitting area LA. For example, the display area DA of each of the display devices 10 may include first to third light-emitting areas LA1, LA2 and LA3. In each of the first to third light-emitting areas LA1, LA2 and LA3, light generated by light-emitting elements of the display devices 10 exits out of the display devices 10.

The first to third light-emitting areas LA1, LA2 and LA3 may emit light having peak wavelengths (e.g., predetermined or selectable peak wavelengths) to the outside of the display devices 10. The first light-emitting area LA1 may emit light of a first color, the second light-emitting area LA2 may emit light of a second color, and the third light-emitting area LA3 may emit light of a third color. For example, the light of the first color may be red light having a peak wavelength in a range of about 610 nm to about 650 nm, the light of the second color may be green light having a peak wavelength in a range of about 510 nm to about 550 nm, and the light of the third color may be blue light having a peak wavelength in a range of about 440 nm to about 480 nm. It is, however, to be understood that the embodiment described herein is not limited thereto.

The first to third light-emitting areas LA1, LA2, and LA3 may be arranged repeatedly and sequentially in the first direction (X-axis direction) of the display area DA. For example, the area of the third light-emitting area LA3 may be larger than the area of the first light-emitting area LA1, and the area of the first light-emitting area LA1 may be larger than the area of the section light-emitting area LA3. However, the disclosure is not limited thereto. For another example, the area of the first light-emitting area LA1, the area of the second light-emitting area LA2 and the area of the third light-emitting area LA3 may be substantially all of equal size. For another example, the area of the first light-emitting area LA1, the area of the second light-emitting area LA2, the area of the third light-emitting area LA3 may be substantially the same.

The display areas DA of the display devices 10 may include a light blocking area BA surrounding the light-emitting areas LA. The light blocking area BA can prevent a mixture of rays of light emitted from the first to third light-emitting areas LA1, LA2 and LA3.

The tiled display device TD may have, but is not limited to, a generally planar shape. The tiled display device TD may have a three-dimensional shape, giving a viewer a three-dimensional experience. For example, in case that the tiled display device TD has a three-dimensional shape, at least some of the display devices 10 may have a curved shape. For another example, the display devices 10 may have a flat shape and are connected with one another at an angle (e.g., a predetermined or selectable angle), so that the tiled display device TD may have a three-dimensional shape.

The tiled display device TD may include seams SM located between the display areas DA. The tiled display device TD may be formed by connecting non-display areas NDA of the adjacent display devices 10 with one another. The display devices 10 may be connected with one another through coupling members or adhesive members disposed in (or included in) the seams SM. The seams SM may not include a pad part or a flexible film attached to the pad part. Accordingly, the display areas DA of the display devices 10 may be so close to each other that the seams SM therebetween are not recognized by a viewer. The reflectance of external light at the display areas DA of the display devices 10 may be substantially equal to the reflectance of external light at the seams SM between the display devices 10. Accordingly, it is possible to prevent the seams SM between the display devices 10 of the tiled display device TD from being recognized by a viewer, thereby eliminating visible seams and allowing the viewer to get immersed into the displayed images without being hindered by an unsightly seam between adjacent display areas (e.g., between adjacent display devices).

Figure 2:
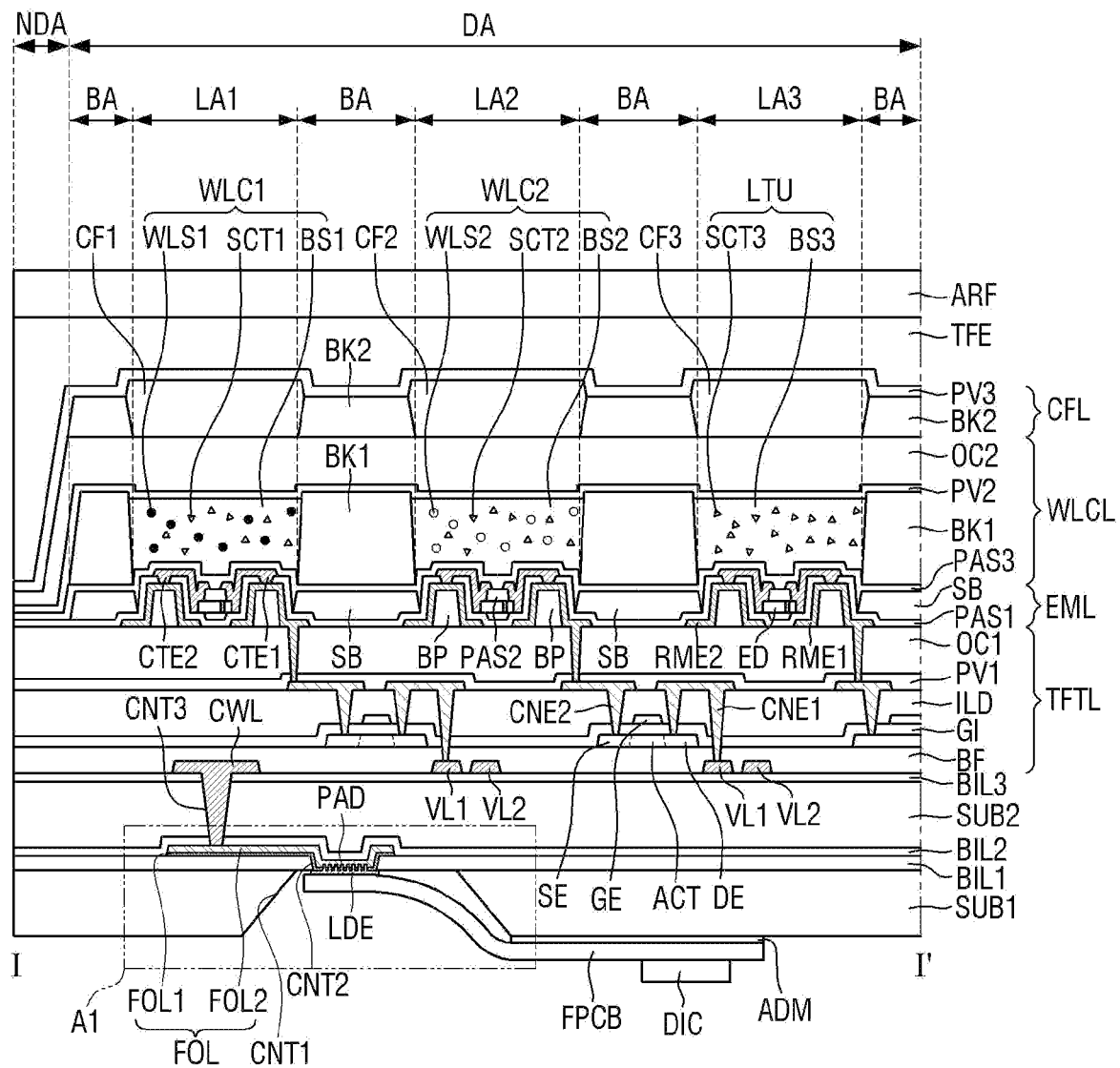
FIG. 2 is a schematic cross-sectional view taken along line I-I' of FIG. 1.
Figure 3:
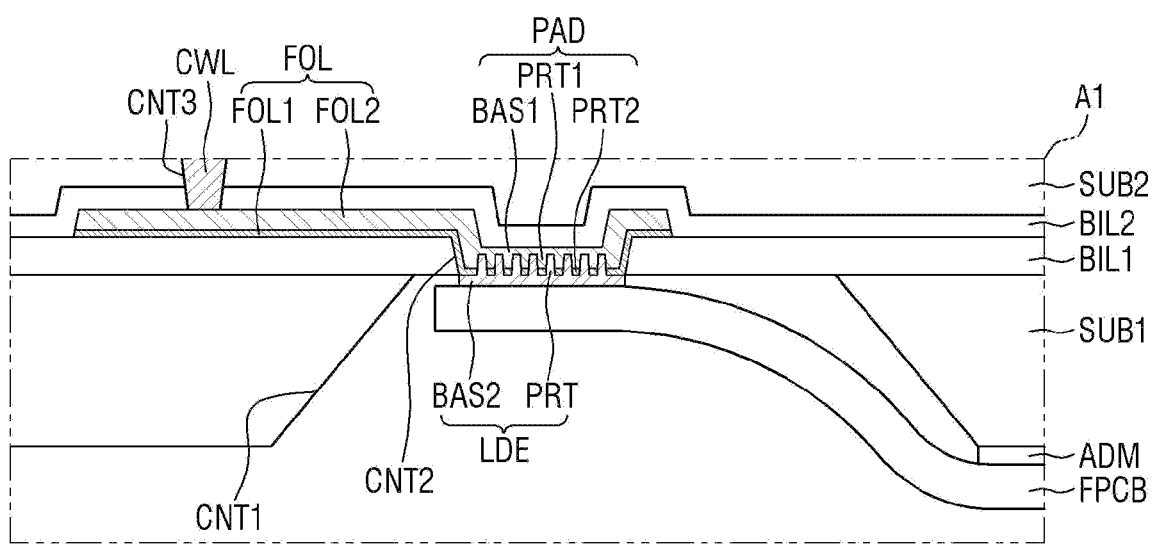
FIG. 3 is a schematic enlarged view of portion A1 of FIG. 2.
Figure 3:
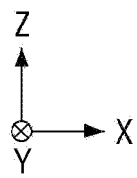
Figure 4:
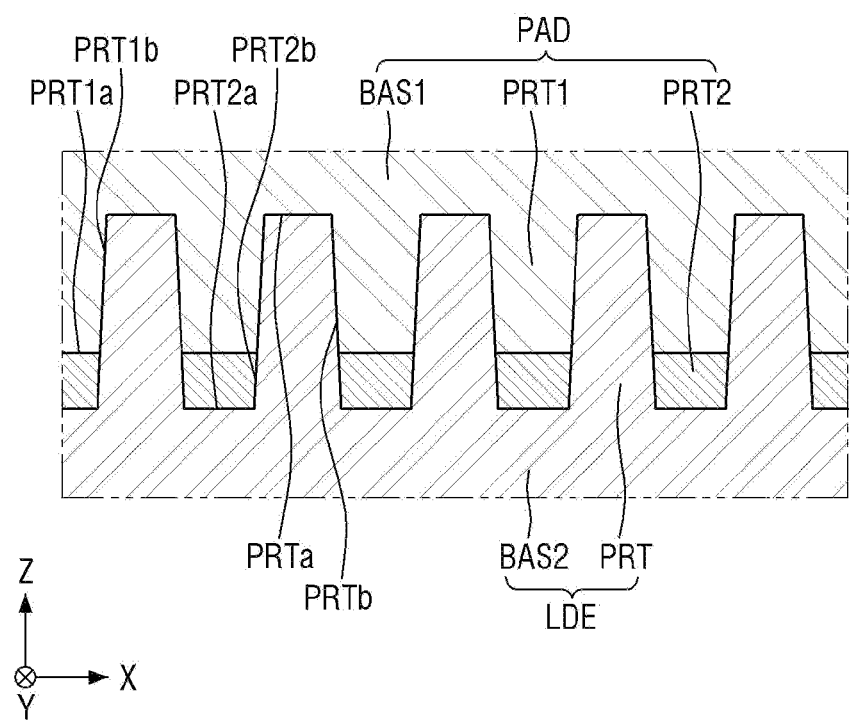
FIG. 4 is a schematic cross-sectional view showing coupling between a pad part and a lead electrode in a display device according to an embodiment.
Figure 5:
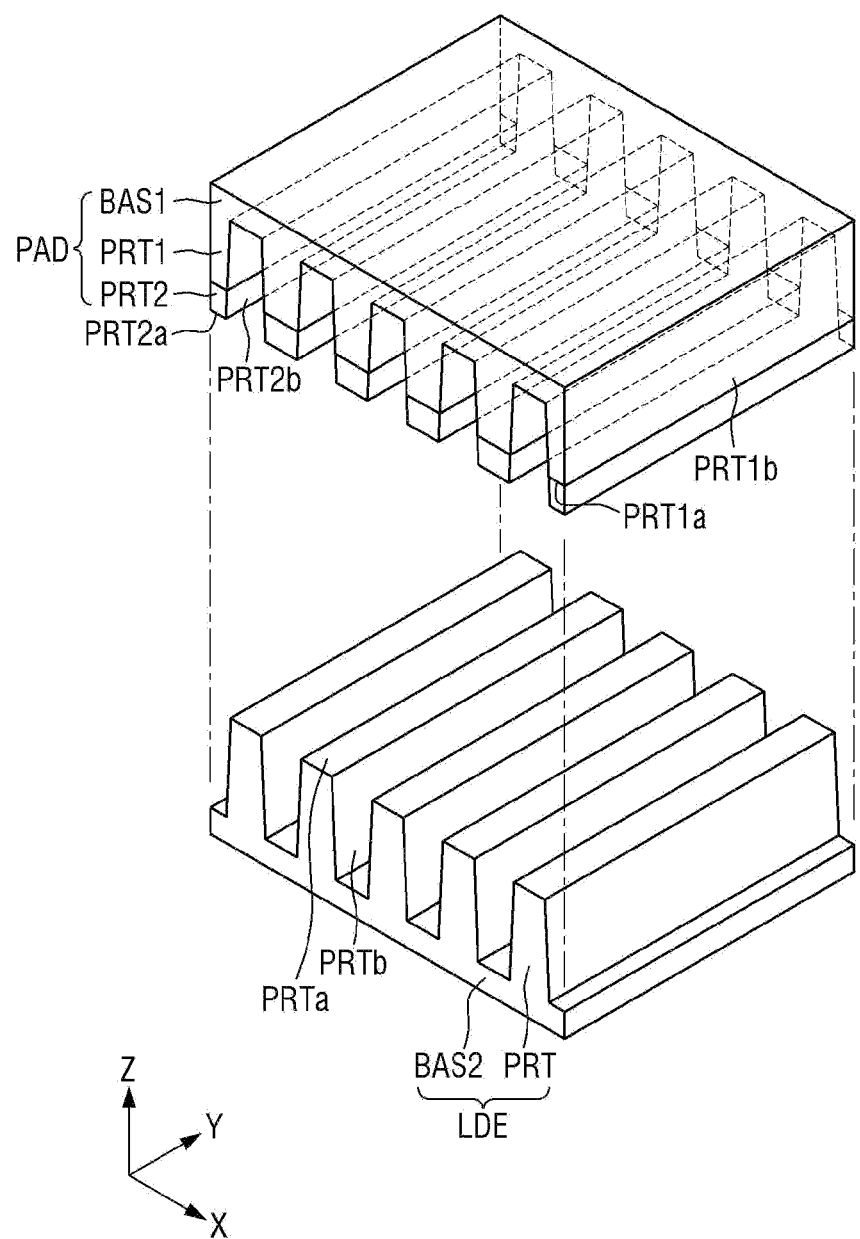
FIG. 5 is a schematic perspective view showing a pad part and a lead electrode in a display device according to an embodiment.
Figure 6:
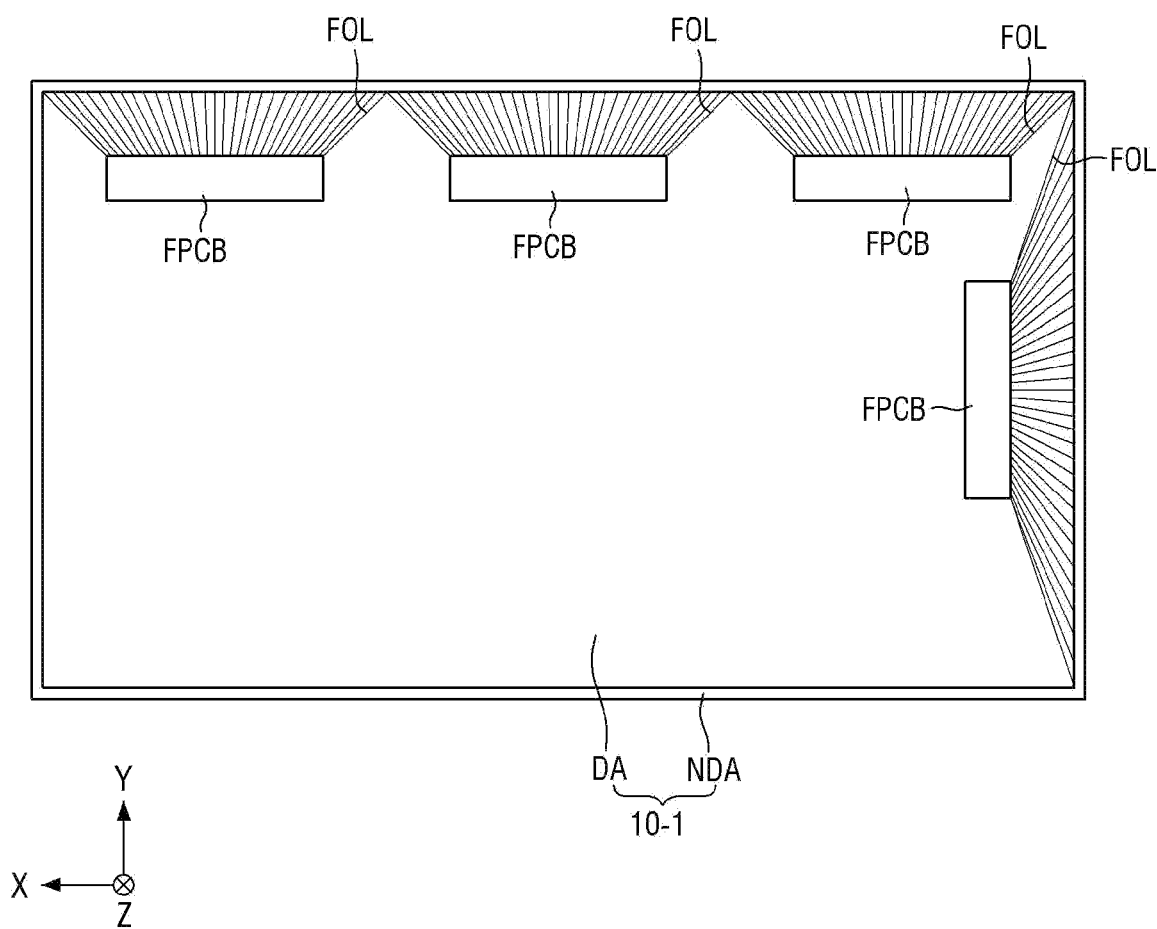
FIG. 6 is a schematic bottom view showing a display device according to an embodiment.
Figure 7:
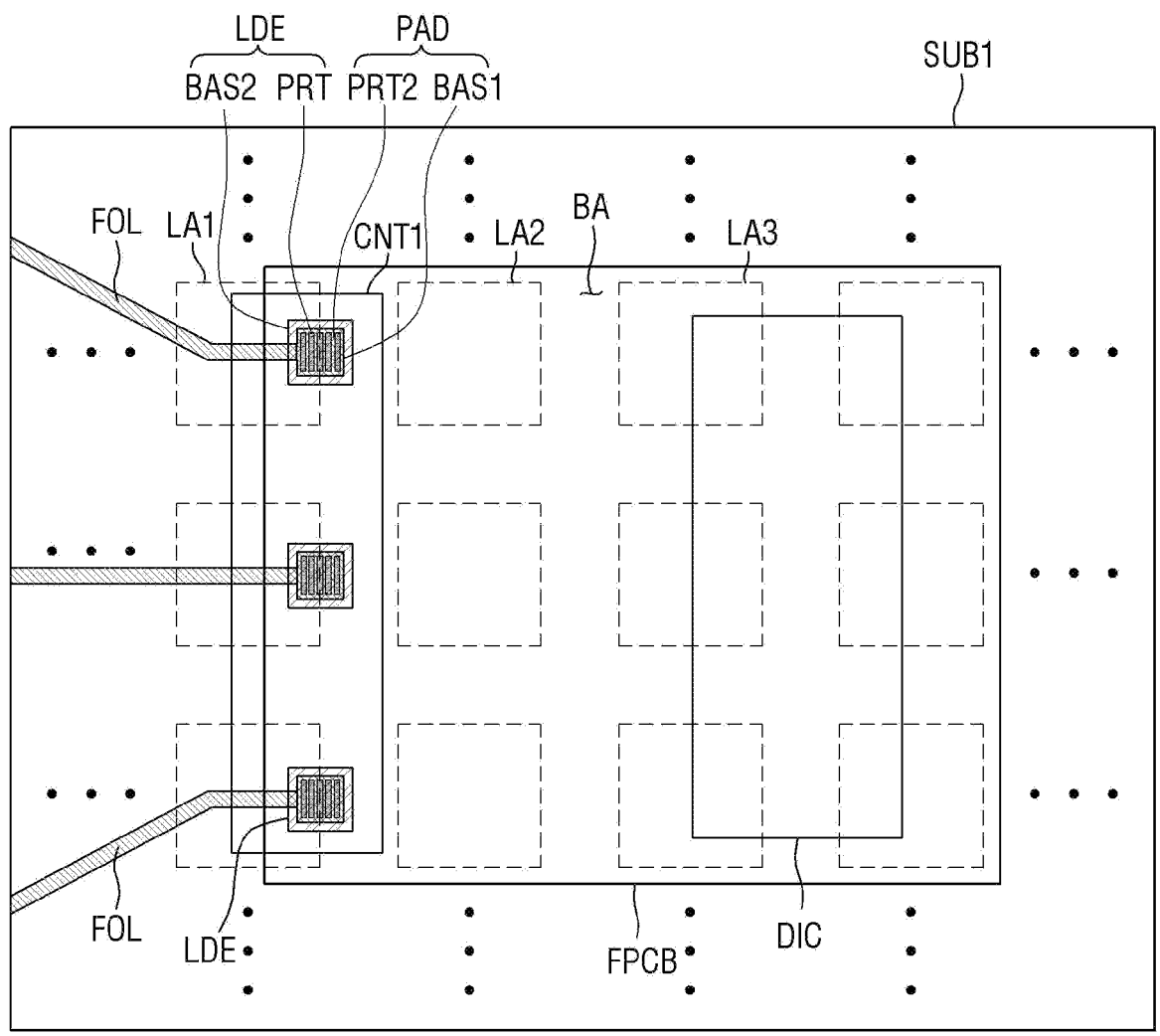
FIG. 7 is a schematic exploded bottom view showing a portion of a display device according to an embodiment.

FIG. 2 is a schematic cross-sectional view taken along line I-I' of FIG. 1, and FIG. 3 is a schematic enlarged view of portion A1 of FIG. 2. FIG. 4 is a schematic cross-sectional view illustrating coupling between a pad part and a lead electrode in a display device according to an embodiment, and FIG. 5 is a schematic perspective view illustrating a pad part and a lead electrode in a display device according to an embodiment. FIG. 6 is a schematic bottom view illustrating a display device according to an embodiment, and FIG. 7 is a schematic exploded bottom view illustrating a portion of a display device according to an embodiment.

Referring to FIGS. 2 to 7, a display area DA of the display device 10 may include first to third light-emitting areas LA1, LA2, and LA3. In each of the first to third light-emitting areas LA1, LA2 and LA3, light generated by light-emitting elements ED of the display devices 10 exits out of the display devices 10.

The display device 10 may include a first substrate SUB1, a first barrier insulating layer BILL a first metal layer MTL1, a second barrier insulating layer BIL2, a second substrate SUB2, a third barrier insulating layer BIL3, a display layer DPL, an encapsulating layer TFE, an anti-reflection film ARF, a flexible film FPCB, and a display driver DIC.

The first substrate SUB1 may support the display device 10. The first substrate SUB1 may be a base substrate or a base member. The first substrate SUB1 may be a flexible substrate that may be bent, folded, rolled, or the like. For example, the first substrate SUB1 may include, but is not limited to, an insulating material, such as polyimide (PI). For another example, the first substrate SUB1 may be a rigid substrate including a glass material.

The first substrate SUB1 may include a first contact hole CNT1. The first contact hole CNT1 may be formed to penetrate the first substrate SUB1 by etching from a lower surface of the first substrate SUB1 to an upper surface of the first substrate SUB1. For example, a width of a lower portion of the first contact hole CNT1 may be greater than a width of an upper portion of the first contact hole CNT1. During the manufacturing process of the display device 10, a pad part PAD inserted into a second contact hole CNT2 may be exposed by the first contact hole CNT1, and the pad part PAD may be connected to a lead electrode LDE of a flexible film FPCB inserted into the first contact hole CNT1.

The first barrier insulating layer BIL1 may be disposed on the first substrate SUB1. The first barrier insulating layer BIL1 may include an inorganic layer that is capable of protecting against air or water infiltration. For example, the first barrier insulating layer BIL1 may include, but is not limited to, at least one of a silicon nitride layer, a silicon oxynitride layer, a silicon oxide layer, a titanium oxide layer, an aluminum oxide layer, or an amorphous silicon layer.

The first barrier insulating layer BIL1 may include a second contact hole CNT2. The second contact hole CNT2 may be formed to penetrate the first barrier insulating layer BIL1 by etching from an upper surface of the first barrier insulating layer BIL1 to a lower surface of the first barrier insulating layer BIL1. For example, a width of an upper portion of the second contact hole CNT2 may be greater than a width of a lower portion of the second contact hole CNT2.

The first metal layer MTL1 may be disposed on the first barrier insulating layer BIL1. The first metal layer MTL1 may include a fan-out line FOL. The first metal layer MTL1 may be made up of a single layer or multiple layers of at least one of molybdenum (Mo), aluminum (Al), chromium (Cr), gold (Au), silver (Ag), titanium (Ti), nickel (Ni), palladium (Pd), indium (In), neodymium (Nd) and copper (Cu).

The fan-out line FOL may include a lower fan-out line FOL1 disposed on the first barrier insulating layer BIL1 and an upper fan-out line FOL2 disposed on the lower fan-out line FOL1. For example, the lower fan-out line FOL1 may include titanium (Ti) which facilitates formation of the lower fan-out line FOL1 on the first barrier insulating layer BIL1, but the constituent material of the lower fan-out line FOL1 is not limited to titanium (Ti). The upper fan-out line FOL2 may include copper (Cu) which facilitates contact between the upper fan-out line FOL2 and a connection line CWL inserted into a third contact hole CNT3, but the constituent material of the upper fan-out line FOL2 is not limited to copper (Cu). A thickness of the upper fan-out line FOL2 may be greater than a thickness of the lower fan-out line FOL1. The thickness of the upper fan-out line FOL2 may be 10 times or more the thickness of the lower fan-out line FOL1. However, the disclosure is not limited thereto.

The pad part PAD may be integral with the fan-out line FOL and be inserted into the second contact hole CNT2. The pad part PAD may be electrically connected to the flexible film FPCB and the connection line CWL. The pad part PAD may be exposed by the first contact hole CNT1 of the first substrate SUB1, and the pad part PAD may be connected to the lead electrode LDE of the flexible film FPCB inserted into the first contact hole CNT1. The fan-out line FOL may be electrically connected to a data line, a power line, or a gate line through the connection line CWL. The data line or power line may be connected to a drain electrode DE of a thin film transistor TFT. The gate line may be connected to a gate electrode GE of the thin film transistor TFT. Accordingly, the fan-out line FOL may provide a data voltage, a power supply voltage, or a gate signal received from the display driver DIC of the flexible film FPCB to the thin film transistor TFT of a pixel through the connection line CWL.

The display device 10 includes the fan-out line FOL disposed in the display area DA, thereby reducing the area of the non-display area NDA.

The pad part PAD may include a first base BAS1, first protrusions PRT1, and second protrusions PRT2. The first base BAS1 may support the first protrusions PRT1. The first base BAS1 may have a plate shape on a lower surface of the second barrier insulating layer BIL2.

The first protrusions PRT1 may protrude from the first base BAS1 in a direction opposite to a third direction (Z-axis direction). The first protrusions PRT1 may extend in the second direction (Y-axis direction), and may be spaced apart from each other in the first direction (X-axis direction). The first base BAS1 and the first protrusions PRT1 may be integral with each other. The first base BAS1, the first protrusions PRT1, and the upper fan-out line FOL2 may be made of (or may include) a same material. A lower surface PRT1a of the first protrusion PRT1 may support the second protrusion PRT2. A side surface PRT1b of the first protrusion PRT1 may be bonded to a side surface PRTb of a protrusion PRT of the lead electrode LDE. For example, the pad part PAD and the lead electrode LDE may be bonded by metal diffusion via thermocompression bonding or ultrasonic bonding. The area of a lower portion of the first protrusion PRT1 may be smaller than the area of an upper portion of the first protrusion PRT1. It is, however, to be understood that the embodiment described herein is not limited thereto.

The second protrusions PRT2 may protrude from the first protrusions PRT1 in a direction opposite to a third direction (Z-axis direction). The height of the second protrusions PRT2 may be lower than the height of the first protrusions PRT1. It is, however, to be understood that the embodiment described herein is not limited thereto. The second protrusions PRT2 may extend in the second direction (Y-axis direction), or may be spaced apart from each other in the first direction (X-axis direction). The second protrusions PRT2 and the lower fan-out line FOL1 may be made of a same material. A lower surface PRT2a of the second protrusion PRT2 may face a second base BAS2 of the lead electrode LDE. A side surface PRT2b of the second protrusion PRT2 may be bonded to the side surface PRTb of the protrusion PRT of the lead electrode LDE. For example, the pad part PAD and the lead electrode LDE may be bonded by metal diffusion via thermocompression bonding or ultrasonic bonding. The area of a lower portion of the second protrusion PRT2 may be smaller than the area of an upper portion of the second protrusion PRT2. It is, however, to be understood that the embodiment described herein is not limited thereto.

The second barrier insulating layer BIL2 may be disposed on the first barrier insulating layer BIL1 and the first metal layer MTL1. The second barrier insulating layer BIL2 may include an inorganic layer that is capable of protecting against air or water infiltration. For example, the second barrier insulating layer BIL2 may include, but is not limited to, at least one of a silicon nitride layer, a silicon oxynitride layer, a silicon oxide layer, a titanium oxide layer, an aluminum oxide layer, or an amorphous silicon layer. However, the disclosure is not limited thereto.

The second substrate SUB2 may be disposed on the second barrier insulating layer BIL2. The second substrate SUB2 may be a base substrate or a base member. The second substrate SUB2 may be a flexible substrate that may be bent, folded, rolled, or the like. For example, the second substrate SUB2 may include, but is not limited to, an insulating material, such as polyimide (PI).

The third barrier insulating layer BIL3 may be disposed on the second substrate SUB2. The third barrier insulating layer BIL3 may include an inorganic layer that is capable of protecting against air or water infiltration. For example, the third barrier insulating layer BIL3 may include, but is not limited to, at least one of a silicon nitride layer, a silicon oxynitride layer, a silicon oxide layer, a titanium oxide layer, an aluminum oxide layer, or an amorphous silicon layer. However, the disclosure is not limited thereto.

The third barrier insulating layer BIL3, the second substrate SUB2, and the second barrier insulating layer BIL2 may include a third contact hole CNT3. The third contact hole CNT3 may be formed to penetrate the third barrier insulating layer BIL3 by etching from an upper surface of the third barrier insulating layer BIL3 to a lower surface of the second barrier insulating layer BIL2. For example, a width of an upper portion of the third contact hole CNT3 may be greater than a width of a lower portion of the third contact hole CNT3. During the manufacturing process of the display device 10, an upper surface of the fan-out line FOL may be exposed by the third contact hole CNT3, and the fan-out line FOL may be connected to the connection line CWL inserted into the third contact hole CNT3.

The display layer DPL may be disposed on the third barrier insulating layer BIL3. The display layer DPL may include a thin film transistor layer TFTL, a light emitting element layer EML, a wavelength conversion layer WLCL, and a color filter layer CFL. The thin film transistor layer TFTL may include a second metal layer MTL2, a buffer layer BF, an active layer ACTL, a gate insulating layer GI, an interlayer insulating film ILD, a fourth metal layer MTL4, a first protective layer PV1, and a first planarization layer OC1.

The second metal layer MTL2 may be disposed on the third barrier insulating layer BIL3. The second metal layer MTL2 may include the connection line CWL and first and second voltage lines VL1 and VL2. The connection line CWL and the first and second voltage lines VL1 and VL2 may be made up of a same material and formed in (or on) a same layer, but the disclosure is not limited thereto. For example, the second metal layer MTL2 may be made up of a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd) and copper (Cu) or an alloy thereof.

The connection line CWL may be inserted into the third contact hole CNT3 and be connected to the fan-out line FOL. For example, the connection line CWL may be electrically connected to the data line to supply a data voltage to the thin film transistor TFT. The connection line CWL may be electrically connected to the power line to supply a power supply voltage to the thin film transistor TFT. The connection line CWL may be electrically connected to the gate line to supply a gate signal to the gate electrode GE of the thin film transistor TFT. Accordingly, the connection line CWL may provide the data voltage, the power supply voltage, or the gate signal received from the display driver DIC through the fan-out line FOL to the thin film transistor TFT of the pixel.

The first and second voltage lines VL1 and VL2 may extend in the second direction (Y-axis direction) in the display area DA. The first and second voltage lines VL1 and VL2 may each be electrically connected to the fan-out line FOL. The first and second voltage lines VL1 and VL2 may each be electrically connected to the thin film transistor TFT or the light emitting element ED. For example, each of the first and second voltage lines VL1 and VL2 may be a data line, a driving voltage line, a low-potential line, or an initialization voltage line, but is not limited thereto.

The buffer layer BF may be disposed on the second metal layer MTL2 and the third barrier insulating layer BIL3. The buffer layer BF may include an inorganic material that is capable of protecting against air or water infiltration. For example, the buffer layer BF may include inorganic layers alternately stacked each other.

The active layer ACTL may be disposed on the buffer layer BF. The active layer ACTL may include a semiconductor region ACT, the drain electrode DE, and a source electrode SE of the thin film transistor TFT. The semiconductor region ACT may overlap the gate electrode GE in the third direction (Z-axis direction) and may be insulated from the gate electrode GE by the gate insulating layer GI. The drain electrode DE and the source electrode SE and may be formed by rendering the material of the semiconductor region ACT conductive. The thin film transistor TFT may constitute a pixel circuit of each of the pixels. For example, the thin film transistor TFT may be a driving transistor or a switching transistor of the pixel circuit.

The gate insulating layer GI may be disposed on the active layer ACTL and the buffer layer BF. The gate insulating layer GI may insulate the semiconductor region ACT from the gate electrode GE of the thin film transistor TFT. The gate insulating layer GI may include contact holes through which first and second connection electrodes CNE1 and CNE2 pass, respectively.

The third metal layer MTL3 may be disposed on the gate insulating layer GI. The third metal layer MTL3 may include the gate electrode GE of the thin film transistor TFT. The gate electrode GE may overlap the semiconductor region ACT with the gate insulating layer GI interposed therebetween. The gate electrode GE may receive the gate signal from the gate line. For example, the third metal layer MTL3 may be made up of a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd) and copper (Cu) or an alloy thereof.

The interlayer insulating layer ILD may be disposed on the third metal layer MTL3. The interlayer insulating layer ILD may insulate the third and fourth metal layers MTL3 and MTL4 from each other. The interlayer insulating layer ILD may include contact holes through which the first and second connection electrodes CNE1 and CNE2 pass, respectively.

The fourth metal layer MTL4 may be disposed on the interlayer insulating layer ILD. The fourth metal layer MTL4 may include the first and second connection electrodes CNE1 and CNE2. The first and second connection electrodes CNE1 and CNE2 may be made up of a same material and formed in (or on) a same layer, but the disclosure is not limited thereto. For example, the fourth metal layer MTL4 may be made up of a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd) and copper (Cu) or an alloy thereof.

The first connection electrode CNE1 may electrically connect the first voltage line VL1 and the drain electrode DE of the thin film transistor TFT. An end of the first connection electrode CNE1 may contact the first voltage line VL1 of the second metal layer MTL2, and another end of the first connection electrode CNE1 may contact the drain electrode DE of the active layer ACTL.

The second connection electrode CNE2 may electrically connect the source electrode SE of the thin film transistor TFT and a first electrode RME1. An end of the second connection electrode CNE2 may contact the source electrode SE of the active layer ACTL, and the first electrode RME1 of the light emitting element layer EML may contact another end of the second connection electrode CNE2.

The first protective layer PV1 may be disposed on the fourth metal layer MTL4 and the interlayer insulating layer ILD. The first protective layer PV1 may protect the thin film transistor TFT. The first protective layer PV1 may include a contact hole through which the first electrode RME1 passes.

The first planarization layer OC1 may be provided on the first protective layer PV1 to planarize an upper side of the thin film transistor layer TFTL. For example, the first planarization layer OC1 may include a contact hole through which the first electrode RME1 passes. Here, the contact hole of the first planarization layer OC1 may be connected to the contact hole of the first protective layer PV1. The first planarization layer OC1 may include an organic insulating material, such as polyimide (PI).

The light emitting element layer EML may be disposed on the thin film transistor layer TFTL. The light emitting element layer EML may include protrusion patterns BP, the first electrodes RME1, second electrodes RME2, a first insulating layer PAS1, sub-banks SB, the light emitting elements ED, and a second insulating layer PAS2, first contact electrodes CTE1, second contact electrodes CTE2, and a third insulating layer PASS.

The protrusion patterns BP may be disposed on the first planarization layer OC1. The protrusion patterns BP may protrude from an upper surface of the first planarization layer OC1. The protrusion patterns BP may be disposed in the light emitting area LA or an open region of each of the pixels. The light emitting elements ED may be disposed between the protrusion patterns BP. The protrusion patterns BP may each have inclined side surfaces, and light emitted from the light emitting elements ED may be reflected by the first and second electrodes RME1 and RME2 disposed on the protruding patterns BP. For example, the protruding patterns BP may include an organic insulating material, such as polyimide (PI).

The first electrode RME1 may be disposed on the first planarization layer OC1 and the protrusion pattern BP. The first electrode RME1 may be disposed on the protrusion pattern BP disposed on a side of the light emitting element ED. The first electrode RME1 may be disposed on the inclined side surfaces of the protrusion pattern BP to reflect the light emitted from the light emitting element ED. The first electrode RME1 may be connected to the second connection electrode CNE2 by being inserted into the contact hole provided in the first planarization layer OC1 and the first protective layer PV1. The first electrode RME1 may be electrically connected to an end of the light emitting element ED through the first contact electrode CTE1. For example, the first electrode RME1 may receive a voltage that is proportional to the luminance of the light emitting element ED from the thin film transistor TFT of the pixel.

The second electrode RME2 may be disposed on the first planarization layer OC1 and the protrusion pattern BP. The second electrode RME2 may be disposed on the protrusion pattern BP disposed on another side of the light emitting element ED. The second electrode RME2 may be disposed on the inclined side surfaces of the protrusion pattern BP to reflect the light emitted from the light emitting element ED. The second electrode RME2 may be electrically connected to another end of the light emitting element ED through the second contact electrode CTE2. For example, the second electrode RME2 may receive a low-potential voltage provided to all pixels supplied from a low-potential line.

The first and second electrodes RME1 and RME2 may include a conductive material having high reflectance. For example, the first and second electrodes RME1 and RME2 may include at least one of aluminum (Al), silver (Ag), copper (Cu), nickel (Ni), or lanthanum (La). For another example, the first and second electrodes RME1 and RME2 may include a material such as indium tin oxide (ITO), indium zinc oxide (IZO), indium tin zinc oxide (ITZO), and the like. For still another example, the first and second electrodes RME1 and RME2 may include layers including a transparent conductive layer (or transparent conductive layer) and a metal layer having high reflectance, or may include a single layer including a transparent conductive material and metal having high reflectance. For example, the first and second electrodes RME1 and RME2 may each have a stacked structure of ITO/Ag/ITO, ITO/Ag/IZO, or ITO/Ag/ITZO/IZO.

The first insulating layer PAS1 may be disposed on the first planarization layer OC1 and the first and second electrodes RME1 and RME2. The first insulating layer PAS1 may insulate the first and second electrodes RME1 and RME2 from each other while protecting them. The first insulating layer PAS1 may prevent the light emitting element ED from being damaged by direct contact with the first and second electrodes RME1 and RME2 during the process of aligning the light emitting elements ED.

The sub-bank SB may be disposed on the first insulating layer PAS1 in the light blocking area BA. The sub-banks SB may be disposed at the boundaries of the pixels to define the light emitting elements ED of each of the pixels. The sub-bank SB may have a height (e.g., a predetermined or selectable height) and include an organic insulating material such as polyimide (PI).

The light emitting elements ED may be disposed on the first insulating layer PAS1. The light emitting elements ED may be aligned parallel to each other between the first and second electrodes RME1 and RME2. The length of the light emitting elements ED may be longer than the distance between the first and second electrodes RME1 and RME2. The light emitting element ED may include semiconductor layers and may be defined at an end (e.g., a first end) by a first semiconductor layer and at an opposite end (e.g., a second end) by a second semiconductor layer. The first end of the light emitting element ED may be disposed on the first electrode RME1 and the second end of the light emitting element ED may be disposed on the second electrode RME2. The first end of the light emitting element ED may be electrically connected to the first electrode RME1 via the first contact electrode CTE1, and the second end of the light emitting element ED may be electrically connected to the second electrode RME2 via the second contact electrode CTE2.

The light emitting element ED may have a size of a micrometer or nanometer, and may be an inorganic light emitting diode including an inorganic material. The light emitting element ED may be aligned between the first and second electrodes RME1 and RME2 according to an electric field formed in a specific direction between the first and second electrodes RME1 and RME2 facing each other.

For example, the light emitting elements ED may include an active layer having a same material to emit light of a same wavelength or light of a same color. The light emitted from each of the first to third light emitting areas LA1, LA2, and LA3 of the light emitting element layer EML may have a same color. For example, the light emitting elements ED may emit light of the third color or blue light having a peak wavelength ranging from about 440 nm to about 480 nm, but the disclosure is not limited thereto.

The second insulating layer PAS2 may be disposed on the light-emitting elements ED. The second insulating layer PAS2 may partially surround the light emitting elements ED, and may not cover ends of each of the light emitting elements ED. The second insulating layer PAS2 may protect the light emitting elements ED and fix the light emitting elements ED during the manufacturing process of the display device 10. The second insulating layer PAS2 may fill the space between the light emitting elements ED and the first insulating layer PAS1.

The first contact electrode CTE1 may be disposed on the first insulating layer PAS1 and may be connected to the first electrode RME1 by being inserted into the contact hole provided in the first insulating layer PAS1. For example, the contact hole of the first insulating layer PAS1 may be provided on the protrusion pattern BP, but the disclosure is not limited thereto. An end of the first contact electrode CTE1 may be connected to the first electrode RME1 on the protrusion pattern BP, and another end of the first contact electrode CTE1 may be connected to the first end of the light emitting diode ED.

The second contact electrode CTE2 may be disposed on the first insulating layer PAS1 and may be connected to the second electrode RME2 by being inserted into the contact hole provided in the first insulating layer PAS1. For example, the contact hole of the first insulating layer PAS1 may be provided on the protrusion pattern BP, but the disclosure is not limited thereto. An end of the second contact electrode CTE2 may be connected to the second end of the light emitting element ED, and another end of the second contact electrode CTE2 may be connected to the second electrode RME2 on the protrusion pattern BP.

The third insulating layer PAS3 may be disposed on the first and second contact electrodes CTE1 and CTE3, the sub-banks SB, and the first and second insulating layers PAS1 and PAS2. The third insulating layer PAS3 may be disposed above the light emitting element layer EML to protect the light emitting element layer EML.

The wavelength conversion layer WLCL may be disposed on the light emitting element layer EML. The wavelength conversion layer WLCL may include first light blocking members BK1, a first wavelength conversion part WLC1, a second wavelength conversion part WLC2, a light transmission part LTU, a second protective layer PV2, and a second planarization layer OC2.

The first light blocking members BK1 may each be disposed on the third insulating layer PAS3 in each light blocking area BA. The first light blocking member BK1 may overlap the sub-bank SB in the third direction (Z-axis direction). The first light blocking members BK1 may block the transmission of light. The first light blocking members BK1 may prevent color mixing by preventing intrusion of light between the first to third light emitting areas LA1, LA2 and LA3, thereby improving a color gamut. The first light blocking members BK1 may be disposed in a lattice shape surrounding the first to third light emitting areas LA1, LA2 and LA3 in a plan view.

The first wavelength conversion part WLC1 may be disposed on the third insulating layer PAS3 in the first light emitting area LA1. The first wavelength conversion part WLC1 may be surrounded by the first light blocking members BK1. The first wavelength conversion part WLC1 may convert or shift the peak wavelength of incident light to a first peak wavelength. The first wavelength conversion part WLC1 may include a first base resin BS1, first scatterers SCT1, and first wavelength shifters WLS1.

The first base resin BS1 may include a material having relatively high light transmittance. The first base resin BS1 may be made of a transparent organic material. For example, the first base resin BS1 may include at least one of organic materials such as an epoxy-based resin, an acrylic-based resin, a cardo-based resin, and an imide-based resin.

The first scatterers SCT1 and the first base resin BS1 may have different refractive indices, and the first scatterers SCT1 may form an optical interface with the first base resin BS1. For example, the first scatterers SCT1 may include a light scattering material or light scattering particles that scatter at least a part of transmitted light. For example, the first scatterers SCT1 may include metal oxide such as titanium oxide ($TiO_2$), zirconium oxide ($ZrO_2$), aluminum oxide ($Al_2O_3$), indium oxide ($In_2O_3$), zinc oxide (ZnO) or tin oxide ($SnO_2$), or may include organic particles such as acrylic resin or urethane-based resin. The first scatterers SCT1 may scatter incident light in random directions regardless of the incident direction of the incident light without substantially converting the peak wavelength of the incident light.

The first wavelength shifters WLS1 may convert or shift the peak wavelength of incident light to the first peak wavelength. For example, the first wavelength shifters WLS1 may convert blue light provided by the display device 10 into red light having a single peak wavelength ranging from about 610 nm to about 650 nm, and may emit the red light. The first wavelength shifters WLS1 may be quantum dots, quantum rods, or phosphors. The quantum dots may be particulate materials that emit light of a specific color in case that electrons transition from a conduction band to a valence band.

A part of the blue light provided from the light emitting element layer EML may pass through the first wavelength conversion part WLC1 without being converted into red light by the first wavelength shifters WLS1. Of the blue light provided by the light emitting element layer EML, light incident on a first color filter CF1 without being converted by the first wavelength conversion part WLC1 may be blocked by the first color filter CF1. Red light which is produced by converting the blue light, provided by the light emitting element layer EML, by the first wavelength conversion part WLC1, may be emitted to the outside through the first color filter CF1. Therefore, the first light emitting area LA1 may emit red light.

The second wavelength conversion part WLC2 may be disposed on the third insulating layer PAS3 in the second light emitting area LA2. The second wavelength conversion part WLC2 may be surrounded by the first light blocking members BK1. The first wavelength conversion part WLC2 may convert or shift the peak wavelength of incident light to a second peak wavelength. The second wavelength conversion part WLC2 may include a second base resin BS2, second scatterers SCT2, and second wavelength shifters WLS2.

The second base resin BS2 may include a material having relatively high light transmittance. The second base resin BS2 may be made of a transparent organic material. For example, the second base resin BS2 and the first base resin BS1 may be made of a same material, or may be made of at least one of the materials that may be used to form the first base resin BS1, e.g., as discussed herein.

The second scatterers SCT2 and the second base resin BS2 may have different refractive indices, and the second scatterers SCT2 may form an optical interface with the second base resin BS2. For example, the second scatterers SCT2 may include a light scattering material or light scattering particles that scatter at least a part of transmitted light. For example, the second scatterers SCT2 and the first scatterers SCT1 may be made of a same material, or may be made of at least one of the materials that may be used to form the first scatterers SCT1, e.g., as discussed herein.

The second wavelength shifters WLS2 may convert or shift the peak wavelength of incident light to a second peak wavelength different from the first peak wavelength of the first wavelength shifters WLS1. For example, the second wavelength shifters WLS2 may convert blue light provided by the display device 10 into green light having a single peak wavelength of about 510 nm to about 550 nm and emit the green light. The second wavelength shifters WLS2 may be quantum dots, quantum rods, or phosphors. The second wavelength shifters WLS2 may include at least one of the materials that may be used to form the first wavelength shifters WLS1, e.g., as discussed herein. The second wavelength shifters WLS2 may be made of quantum dots, quantum rods, or phosphors such that their wavelength conversion range is different from the wavelength conversion range of the first wavelength shifters WLS1.

The light transmission part LTU may be disposed in the third light emitting area LA3 on the third insulating layer PAS3. The light transmission part LTU may be surrounded by the first light blocking members BK1. The light transmission part LTU may transmit incident light while maintaining the peak wavelength of the incident light. The light transmission part LTU may include a third base resin BS3 and third scatterers SCT3.

The third base resin BS3 may include a material having relatively high light transmittance. The third base resin BS3 may be made of a transparent organic material. For example, the third base resin BS3 and the first base resin BS1 or the second base resin BS2 may be made of a same material, or the third base resin BS3 may be made of at least one of the materials that may be used to form the first base resin BS1, e.g., as discussed herein.

The third scatterers SCT3 and the third base resin BS3 may have different refractive indices, and the third scatterers SCT3 may form an optical interface with the third base resin BS3. For example, the third scatterers SCT3 may include a light scattering material or light scattering particles that scatter at least a part of transmitted light. For example, the third scatterers SCT3 and the first or second scatterers SCT1 or SCT2 may be made of a same material, or the third scatterers SCT3 may be made of at least one of the materials that may be used to form the first scatterers SCT1, e.g., as discussed herein.

As the wavelength conversion layer WLCL is disposed directly on the third insulating layer PAS3 of the light emitting element layer EML, the display device 10 may not require a separate substrate for the first and second wavelength conversion parts WLC1 and WLC2 and the light transmission part LTU. Accordingly, the first and second wavelength parts WLC1 and WLC2 and the light transmission part LTU may be easily aligned in the first to third light emitting areas LA1, LA2, and LA3, respectively, and the thickness of the display device 10 can be relatively reduced.

The second protective layer PV2 may cover the first and second wavelength conversion parts WLC1 and WLC2, the light transmission part LTU, and the first light blocking members BK1. For example, the second protective layer PV2 may prevent damage to or contamination of the first and second wavelength conversion parts WLC1 and WLC2 and the light transmission part LTU by sealing the first and second wavelength conversion parts WLC1 and WLC2 and the light transmission part LTU. For example, the second protective layer PV2 may include an inorganic material.

The second planarization layer OC2 may be disposed on the second protective layer PV2 to planarize upper sides of the first and second wavelength conversion parts WLC1 and WLC2 and the light transmission part LTU. For example, the second planarization layer OC2 may include an organic insulating material, such as polyimide (PI).

The color filter layer CFL may be disposed on the wavelength conversion layer WLCL. The color filter layer CFL may include second light blocking members BK2, first to third color filters CF1, CF2 and CF3, and a third protective layer PV3.

The second light blocking members BK2 may be disposed on the second planarization layer OC2 of the wavelength conversion layer WLCL in the light blocking areas BA. The second light blocking members BK2 may overlap the first light blocking members BK1 or the sub-banks SB in the third direction (Z-axis direction). The second light blocking members BK2 may block transmission of light. The second light blocking members BK2 may prevent color mixing by preventing intrusion of light between the first to third light emitting areas LA1, LA2 and LA3, thereby improving the color gamut. The second light blocking members BK2 may be disposed in a lattice shape surrounding the first to third light emitting areas LA1, LA2 and LA3 in a plan view.

The first color filter CF1 may be disposed on the second planarization layer OC2 in the first light emitting area LA1. The first color filter CF1 may be surrounded by the second light blocking members BK2. The first color filter CF1 may overlap the first wavelength conversion part WLC1 in the third direction (Z-axis direction). The first color filter CF1 may selectively transmit light of the first color (e.g., red light) and block or absorb light of the second color (e.g., green light) and light of the third color (e.g., blue light). For example, the first color filter CF1 may be a red color filter and may include a red colorant.

The second color filter CF2 may be disposed on the second planarization layer OC2 in the second light emitting area LA2. The second color filter CF2 may be surrounded by the second light blocking members BK2. The second color filter CF2 may overlap the second wavelength conversion part WLC2 in the third direction (Z-axis direction). The second color filter CF2 may selectively transmit light of the second color (e.g., green light), and may block or absorb light of the first color (e.g., red light) and light of the third color (e.g., blue light). For example, the second color filter CF2 may be a green color filter and may include a green colorant.

The third color filter CF3 may be disposed on the second planarization layer OC2 in the third light emitting area LA3. The third color filter CF3 may be surrounded by the second light blocking members BK2. The third color filter CF3 may overlap the light transmission part LTU in the third direction (Z-axis direction). The third color filter CF3 may selectively transmit light of the third color (e.g., blue light), and may block or absorb light of the first color (e.g., red light) and light of the second color (e.g., green light). For example, the third color filter CF3 may be a blue color filter and may include a blue colorant.

The first to third color filters CF1, CF2, and CF3 may absorb a part of light entering from the outside of the display device 10, thereby reducing reflected light due to external light. Therefore, the first to third color filters CF1, CF2, and CF3 may prevent or reduce color distortion due to external light reflection.

As the first to third color filters CF1, CF2 and CF3 are directly disposed on the second planarization layer OC2 of the wavelength conversion layer WLCL, the display device 10 may not require a separate substrate for the first to third color filters CF1, CF2 and CF3. Therefore, the thickness of the display device 10 can be relatively reduced.

The third protective layer PV3 may cover the first to third color filters CF1, CF2 and CF3 and the second light blocking members BK2. The third protective layer PV3 may protect the first to third color filters CF1, CF2 and CF3.

The encapsulation layer TFE may be disposed on the third protective layer PV3 of the color filter layer CFL. The encapsulation layer TFE may cover top and side surfaces of the display layer DPL. For example, the encapsulation layer TFE may include at least one inorganic layer to prevent penetration of oxygen or moisture. The encapsulation layer TFE may include at least one organic layer to protect the display device 10 from foreign substances such as dust.

The anti-reflection film ARF may be disposed on the encapsulation layer TFE. The anti-reflection film ARF may prevent reflection of external light, thereby reducing a reduction in visibility caused by reflection of the external light. The anti-reflection film ARF may protect an upper surface of the display device 10. The anti-reflection film ARF may be omitted. In another example, the anti-reflection film ARF may be replaced with a polarizing film.

The flexible film FPCB may be disposed below the first substrate SUB1. The flexible film FPCB may be disposed at the edges of a lower surface of the display device 10. The flexible film FPCB may be attached to the lower surface of the first substrate SUB1 by using an adhesive member ADM. The flexible film FPCB may include the lead electrode LDE disposed on an upper surface of a side of the flexible film FPCB. The lead electrode LDE may be inserted into the first contact hole CNT1 and be bonded to the pad part PAD. The flexible film FPCB may support the display driver DIC disposed on a lower surface of another side of the flexible film FPCB. The lead electrode LDE may be electrically connected to the display driver DIC via lead lines (not shown) disposed on the lower surface of the flexible film FPCB. The another side of the flexible film FPCB may be connected to a source circuit board (not shown) at a lower portion of the first substrate SUB1. The flexible film FPCB may transmit a signal and voltage of the display driver DIC to the display device 10.

The lead electrode LDE may include the second base BAS2 and the protrusions PRT. The second base BAS2 may support the protrusions PRT. The second base BAS2 may have a plate shape on an upper surface of the flexible film FPCB.

The protrusions PRT may protrude from the second base BAS2 in the third direction (Z-axis direction). The protrusions PRT may extend in the second direction (Y-axis direction) and may be spaced apart from each other in the first direction (X-axis direction). The second base BAS2 and the protrusions PRT may be integral with each other. The protrusions PRT may be respectively inserted into a space between the first and second protrusions PRT1 and PRT2. Upper surfaces PRTa of the protrusions PRT may face the first base BAS1 of the pad part PAD. A height of the upper surfaces PRTa of the protrusions PRT may be higher than that of the lower surface of the first barrier insulating layer BIL1. The side surface PRTb of each protrusion PRT may be bonded to the side surface PRT1b of each of the first protrusions PRT1 and the side surface PRT2b of the second protrusions PRT2 of the pad part PAD. For example, the lead electrode LDE and the pad part PAD may be bonded by metal diffusion via thermocompression bonding or ultrasonic bonding. The area of an upper portion of the protrusion PRT may be smaller than the area of a lower portion of the protrusion PRT. It is, however, to be understood that the embodiment described herein is not limited thereto.

The display device 10 includes the first and second protrusions PRT1 and PRT2 of the pad part PAD and the protrusions PRT of the lead electrode LDE, thereby increasing the bonding area of the pad part PAD and the lead electrode LDE. Therefore, the display device 10 may improve the conductivity and bonding strength between the pad part PAD and the lead electrode LDE and may easily transmit the signal and voltage of the flexible film FPCB to the fan-out line FOL.

The display driver DIC may be mounted on the flexible film FPCB. The display driver DIC may be an integrated circuit (IC). The display driver DIC may convert digital video data into an analog data voltage based on a data control signal received from a timing controller (not shown), and may provide the analog data voltage to the data lines of the display area DA through the flexible film FPCB. The display driver DIC may supply the power supply voltage received from a power supply part (not shown) to the power lines of the display area DA through the flexible film FPCB. The display driver DIC may generate gate signals based on a gate control signal and sequentially provide the gate signals to gate lines according to the set order. The display device 10 includes the fan-out line FOL disposed on the first substrate SUB1 and the display driver DIC disposed below the first substrate SUB1, thereby reducing the area of the non-display area NDA.

Figure 8:
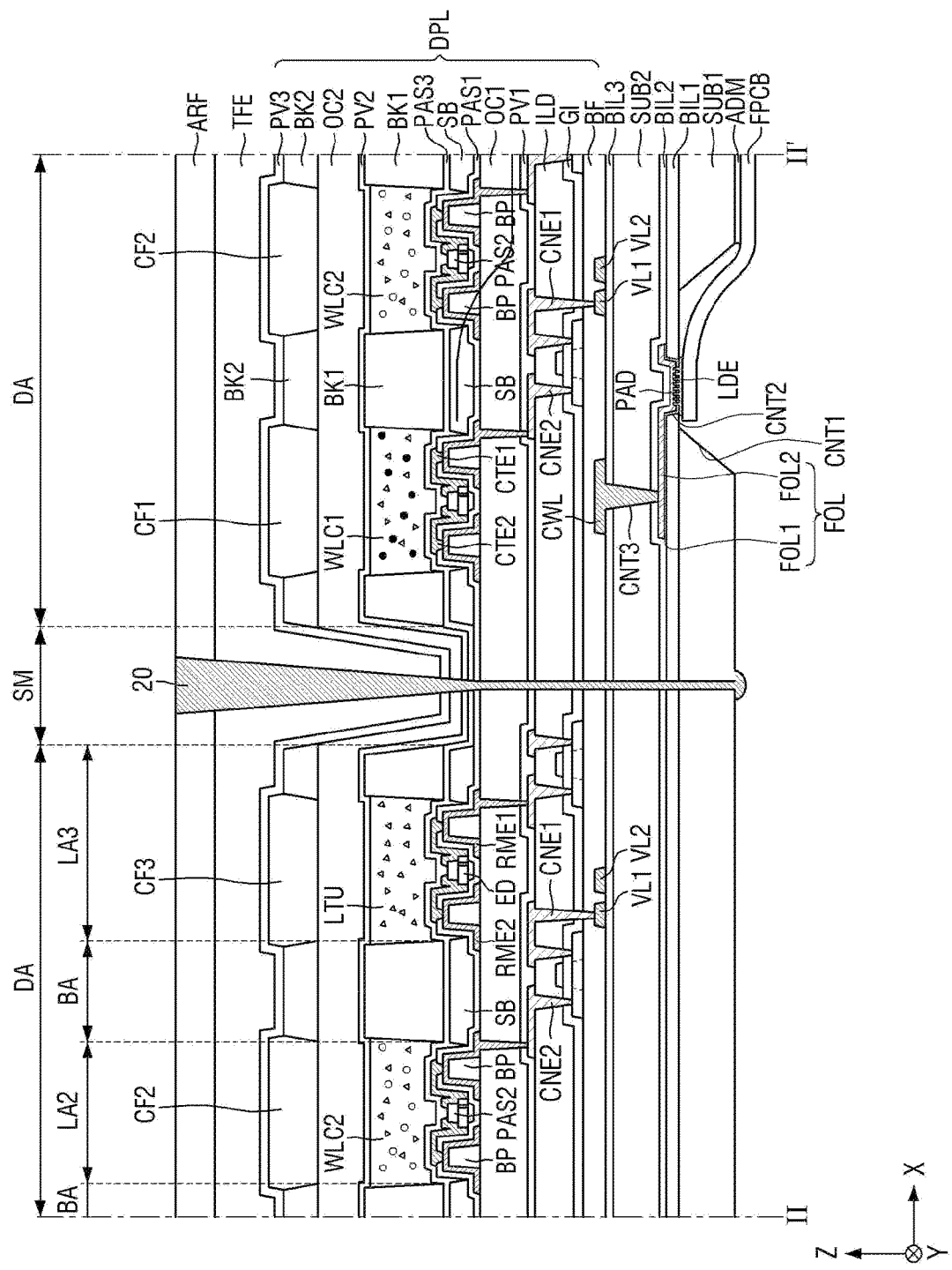
FIG. 8 is a schematic cross-sectional view taken along line II-IF of FIG. 1.

FIG. 8 is a schematic cross-sectional view taken along line II-IF of FIG. 1.

Referring to FIG. 8, the tiled display device TD may include display devices 10 and coupling members 20. The tiled display device TD may include first to fourth display devices 10-1 to 10-4. The number and coupling relationship of the display devices 10 are not limited by the embodiment of FIG. 1. The number of the display devices 10 may be determined depending on the sizes of the display devices 10 and the tiled display device TD.

The display device 10 may include a display area DA and a non-display area NDA. The display area DA may include pixels to display images. The non-display area NDA may be disposed around the display area DA to surround the display area DA, and may not display an image.

The tiled display device TD may include seams SM located between the display areas DA. The tiled display device TD may be formed by connecting non-display areas NDA of the adjacent display devices 10 with one another. The display devices 10 may be connected with one another through coupling members 20 or adhesive members disposed in the seams SM. The seam SM of each of the display devices 10 may not include a pad part or a fan-out line connected to the pad part. Accordingly, the display areas DA of the display devices 10 may be so close to each other that the seams SM therebetween are not recognized by a viewer. The reflectance of external light at the display areas DA of the display devices 10 may be substantially equal to the reflectance of external light at the seams SM between the display devices 10. Accordingly, it is possible to prevent the seams SM between the display devices 10 of the tiled display device TD from being recognized by a viewer, thereby eliminating visible seams and allowing the viewer to get immersed into the displayed images without being hindered by an unsightly seam between adjacent display areas (e.g., between adjacent display devices).

In the tiled display device TD, the side surfaces of the adjacent display devices 10 may be coupled to (or connected to) each other by using the coupling member 20 disposed between the display devices 10. The coupling member 20 may implement the tiled display device TD by connecting the side surfaces of first to fourth display devices 10-1 to 10-4 arranged in a grid shape to each other. The coupling member 20 may couple or connect side surfaces of the first substrate SUB1, the first and second barrier insulating layers BIL1 and BIL2, the second substrate SUB2, the third barrier insulating layer BIL3, the display layer DPL, the encapsulation layer TFE, and the anti-reflection layer ARF of each of the display devices 10 adjacent to each other.

For example, the coupling member 20 may be formed as an adhesive or double-sided tape having a relatively thin or reduced thickness, thereby minimizing the distance between the display devices 10. For another example, the coupling member 20 may be formed as a coupling frame having a relatively thin or reduced thickness, thereby minimizing the distance between the display devices 10. Therefore, the tiled display device TD may prevent the seams SM between the display devices 10 from being recognized by a viewer.

FIGS. 9 to 21 are schematic cross-sectional views illustrating processes of manufacturing a display device according to an embodiment.

Figure 9:
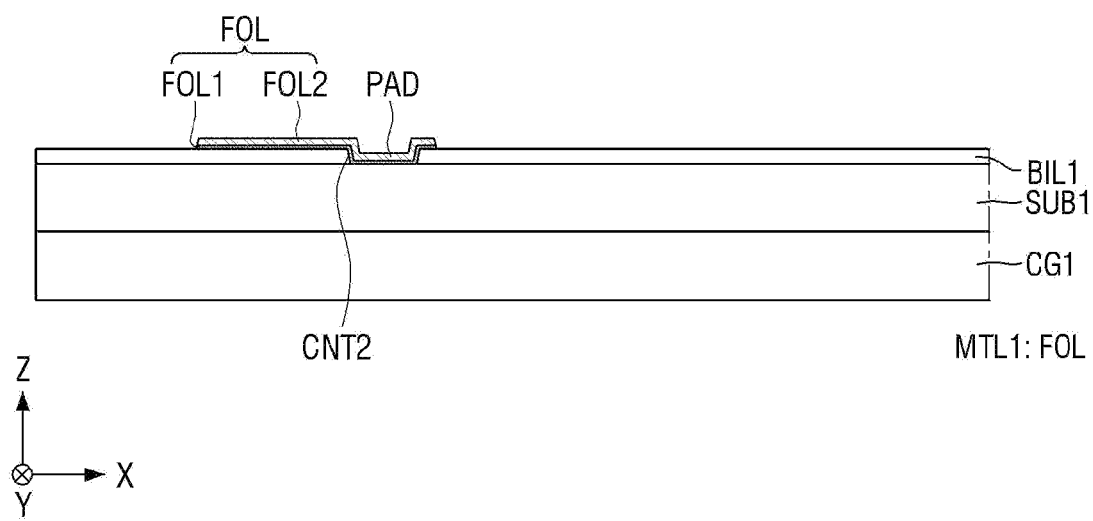
FIGS. 9 to 21 are schematic cross-sectional views showing processes of manufacturing a display device according to an embodiment.

In FIG. 9, a first carrier substrate CG1 may support the display device 10 during the process of manufacturing the display device 10. For example, the first carrier substrate CG1 may be carrier glass, but the disclosure is not limited thereto.

The first substrate SUB1 may be disposed on the first carrier substrate CG1. The first substrate SUB1 may be a base substrate or a base member. For example, the first substrate SUB1 may include, but is not limited to, an insulating material, such as polyimide (PI).

The first barrier insulating layer BIL1 may be disposed on the first substrate SUB1. The first barrier insulating layer BIL1 may include an inorganic layer that is capable of protecting against air or water infiltration. The first barrier insulating layer BIL1 may include a second contact hole CNT2. The second contact hole CNT2 may be etched from an upper surface of the first barrier insulating layer BIL1 to expose a portion of the upper surface of the first substrate SUB1. The second contact hole CNT2 may be formed through a dry etching process or a wet etching process, but the disclosure is not limited thereto.

The first metal layer MTL1 may be disposed on the first barrier insulating layer BILL The first metal layer MTL1 may include a fan-out line FOL. The pad part PAD may be integral with the fan-out line FOL and be inserted into the second contact hole CNT2. The pad part PAD may be disposed on the upper surface of the first substrate SUB1. The first metal layer MTL1 may be made up of a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd) and copper (Cu) or an alloy thereof.

The fan-out line FOL may include a lower fan-out line FOL1 disposed on the first barrier insulating layer BIL1 and an upper fan-out line FOL2 disposed on the lower fan-out line FOL1. For example, the lower fan-out line FOL1 may include titanium (Ti) which facilitates formation of the lower fan-out line FOL1 on the first barrier insulating layer BILL but the constituent material of the lower fan-out line FOL1 is not limited to titanium (Ti). The upper fan-out line FOL2 may include copper (CU), but the constituent material of the upper fan-out line FOL2 is not limited thereto. A thickness of the upper fan-out line FOL2 may be greater than a thickness of the lower fan-out line FOL1. The thickness of the upper fan-out line FOL2 may be 10 times or more the thickness of the lower fan-out line FOL1.

Figure 10:
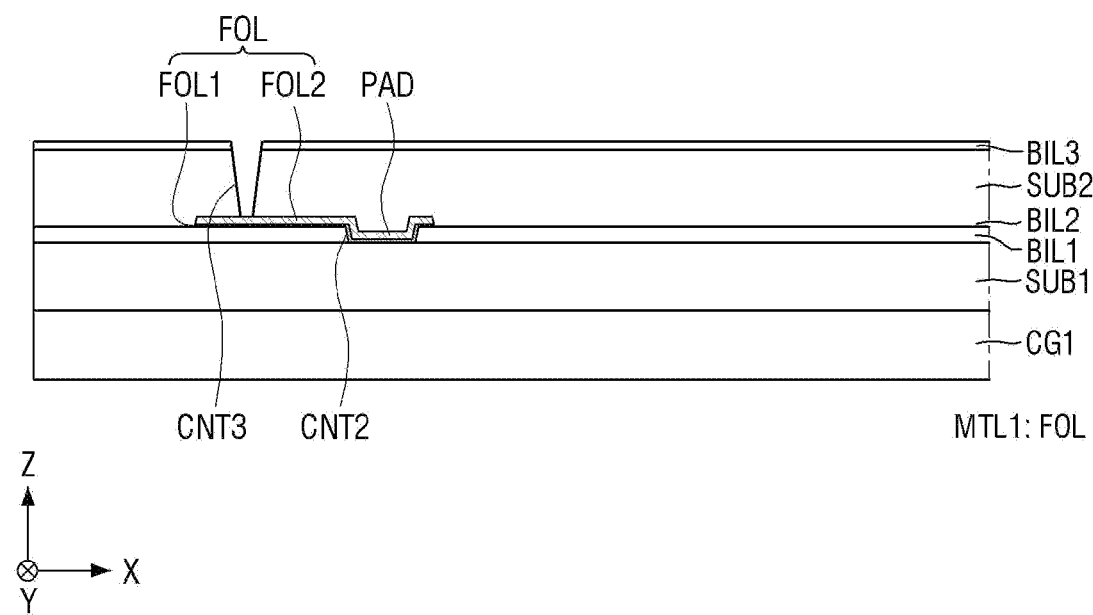

In FIG. 10, the second barrier insulating layer BIL2 may be disposed on the first barrier insulating layer BIL1 and the fan-out line FOL. The second substrate SUB2 and the third barrier insulating layer BIL3 may be sequentially stacked on the second barrier insulating layer BIL2. The third contact hole CNT3 may be formed to penetrate the second barrier insulating layer BIL2 by etching from an upper surface of the third barrier insulating layer BIL3 to a lower surface of the second barrier insulating layer BIL2. For example, the second and third barrier insulating layers BIL2 and BIL3 and the second substrate SUB2 may be penetrated by a dry etching process or a wet etching process, but the disclosure is not limited thereto. The upper surface of the fan-out line FOL may be exposed by the third contact hole CNT3.

Figure 11:
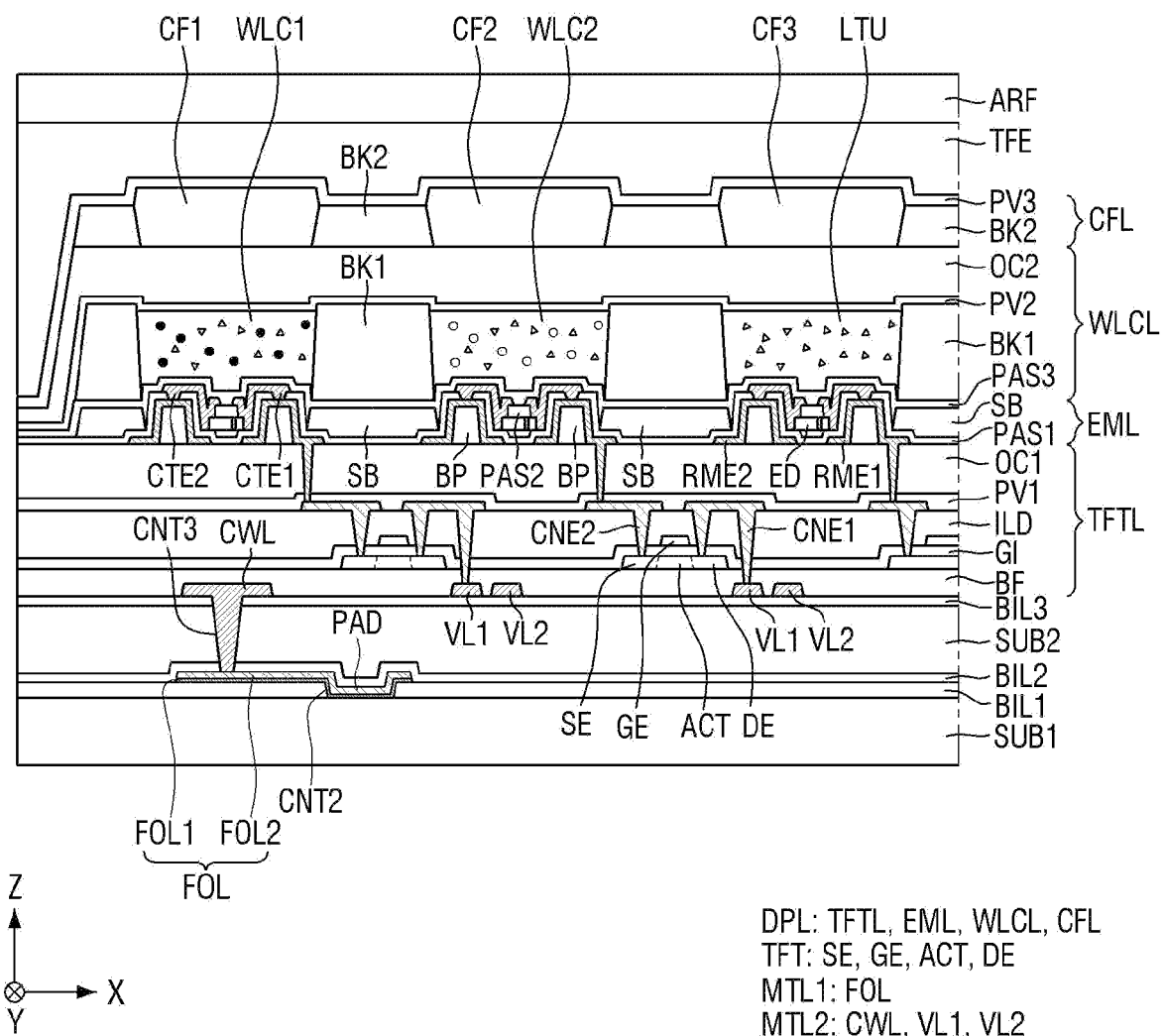

In FIG. 11, the display layer DPL may be stacked on the third barrier insulating layer BIL3. The thin film transistor layer TFTL, the light emitting element layer EML, the wavelength conversion layer WLCL, and the color filter layer CFL may be sequentially stacked on the third barrier insulating layer BIL3. The encapsulation layer TFE may cover top and side surfaces of the display layer DPL. The anti-reflection film ARF may be formed on the encapsulation layer TFE.

Figure 12:
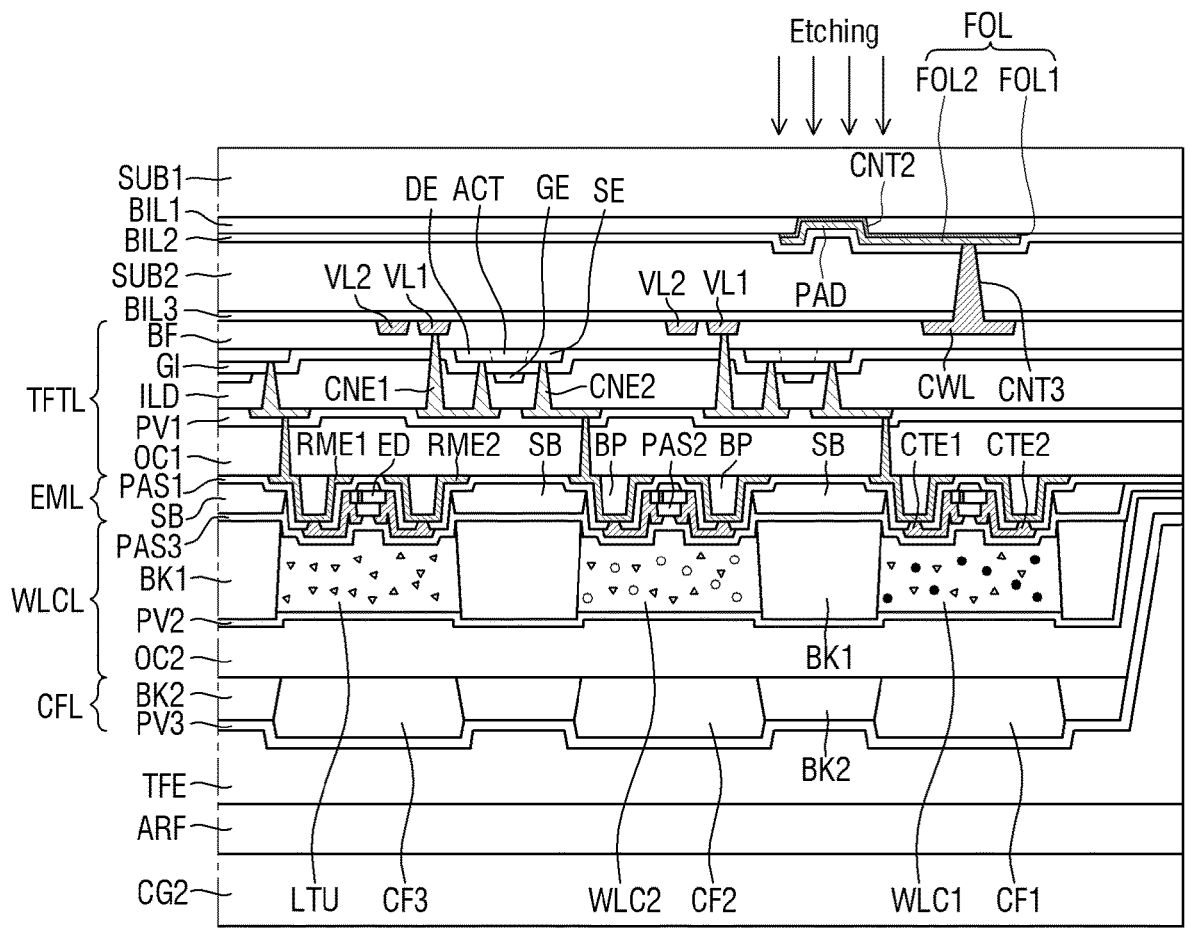
Figure 13:
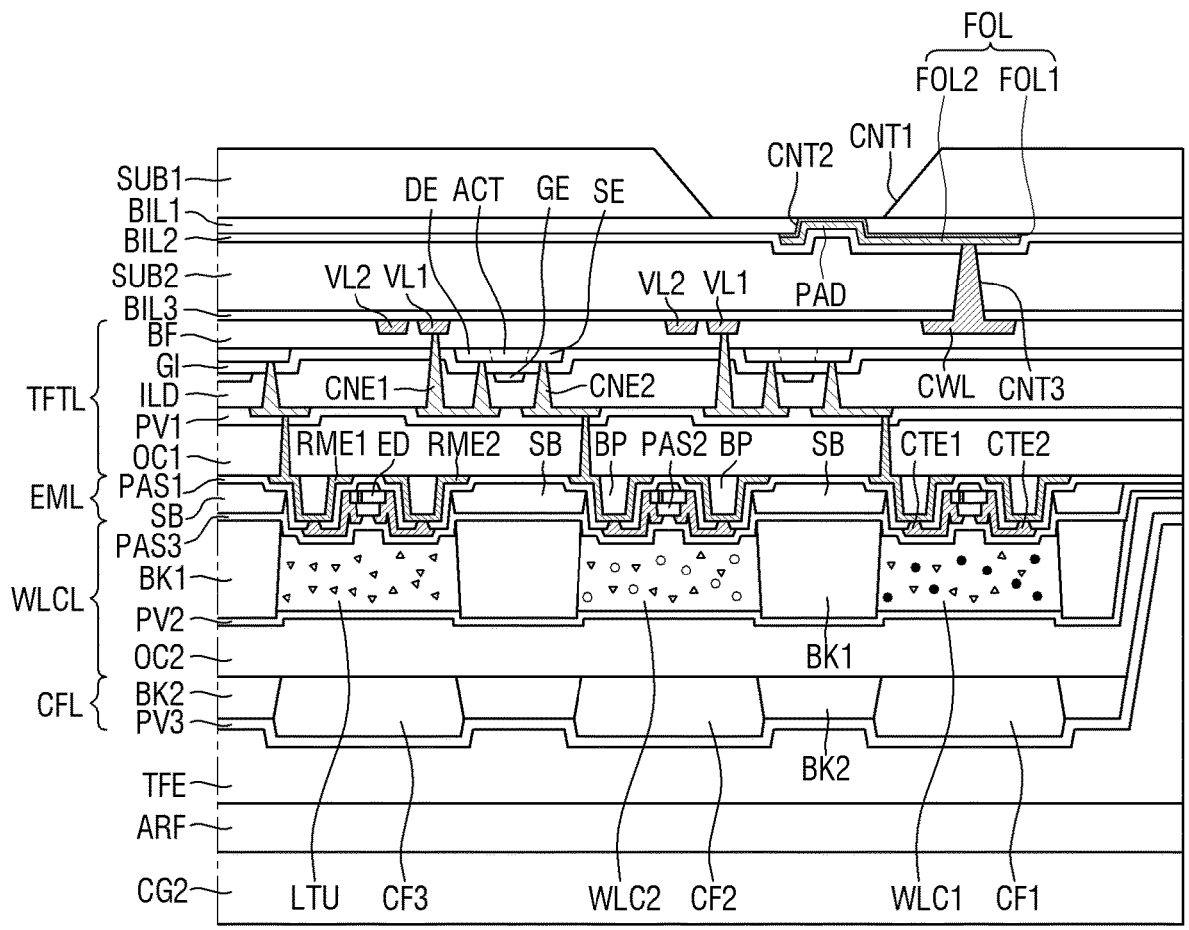

In FIGS. 12 and 13, the display device 10 being manufactured may be turned over in order to attach the flexible film FPCB thereto. The first carrier substrate CG1 may be removed from the first substrate SUB1. For example, the first carrier substrate CG1 may be removed from the lower surface of the first substrate SUB1 by using a sacrificial layer (not shown) interposed between the first carrier substrate CG1 and the first substrate SUB1, but the disclosure is not limited thereto.

A second carrier substrate CG2 may be disposed on a surface of the anti-reflection film ARF. The second carrier substrate CG2 may support the display device 10 turned over. For example, the second carrier substrate CG2 may be carrier glass, but the disclosure is not limited thereto.

A surface of the first substrate SUB1 may be subjected to at least one of a dry etching process, a plasma etching process, or a laser etching process. For example, a surface of the first substrate SUB1 may be patterned through an atmospheric pressure (AP) plasma process. Accordingly, the first contact hole CNT1 may be provided in the first substrate SUB1 and may expose the pad part PAD.

FIGS. 14 to 19 may be schematic enlarged views of the vicinity of the first contact hole CNT during the manufacturing process of the display device 10.

Figure 14:
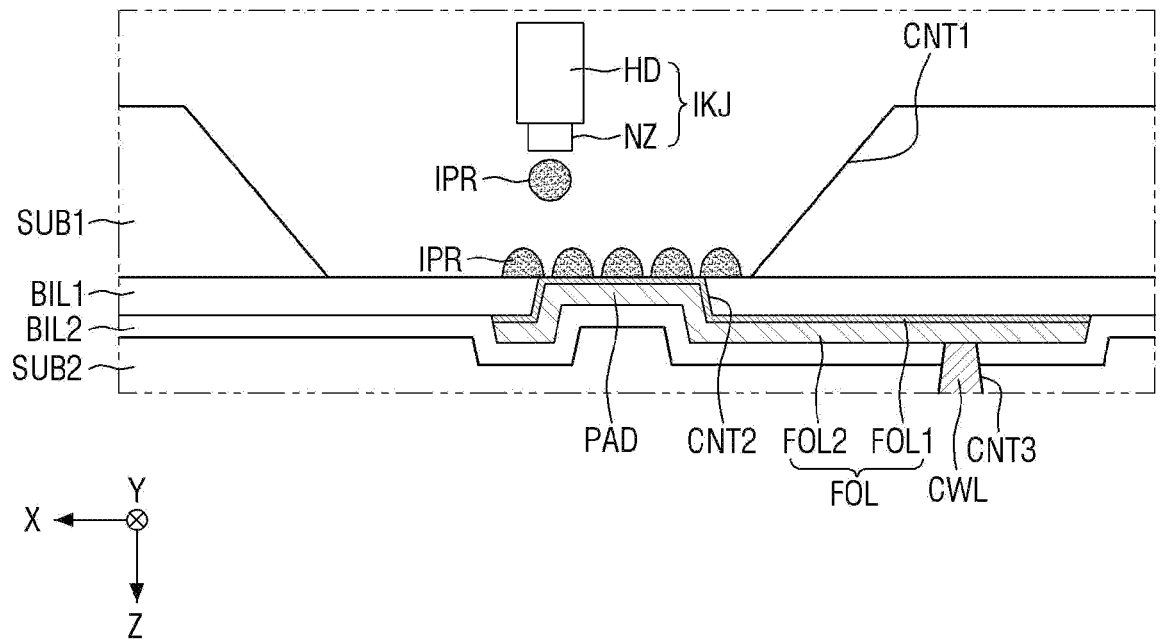

In FIG. 14, the display device 10 may spray a liquid imprint resin IPR onto the pad part PAD by using an ink ejecting device IKJ. The ink ejecting device IKJ may include an inkjet head HD and a nozzle NZ. The inkjet head HD may be aligned above the pad part PAD exposed by the first contact hole CNT1. For example, the ink ejecting device IKJ may spray the thermoset imprint resin IPR by using the nozzle NZ.

Figure 15:
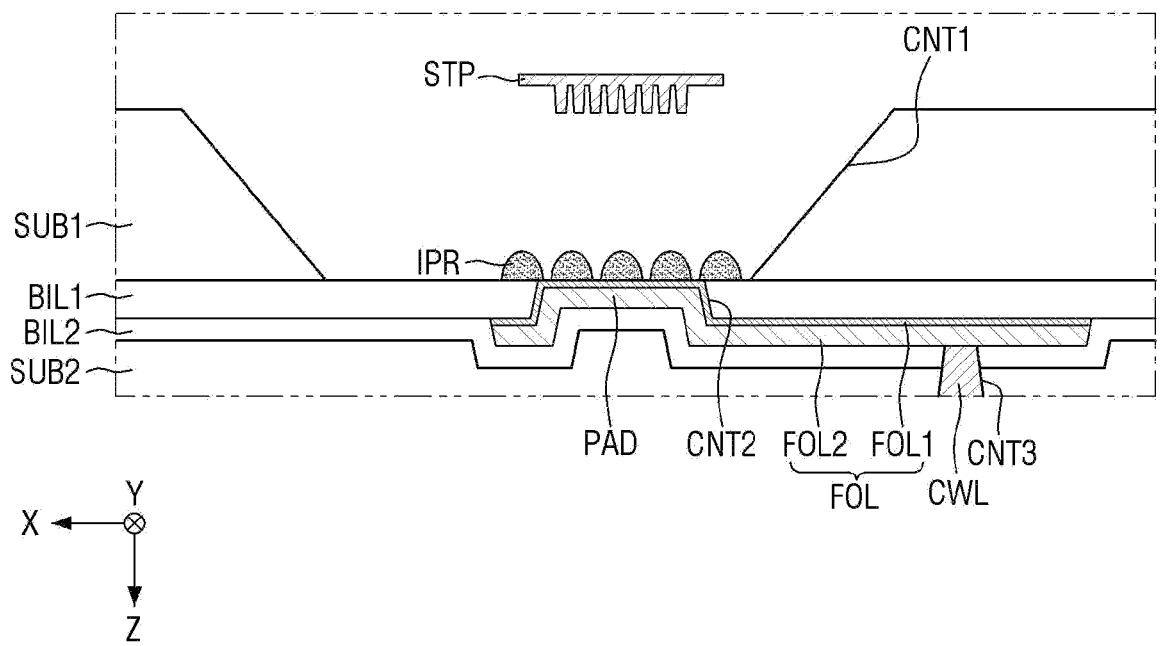
Figure 16:
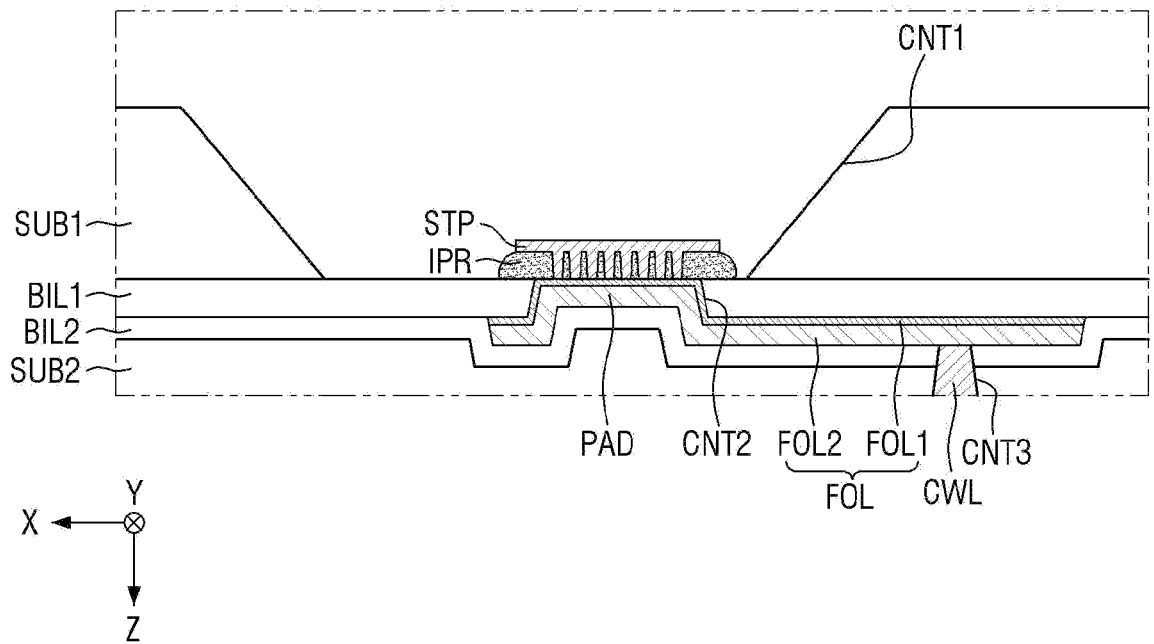
Figure 17:
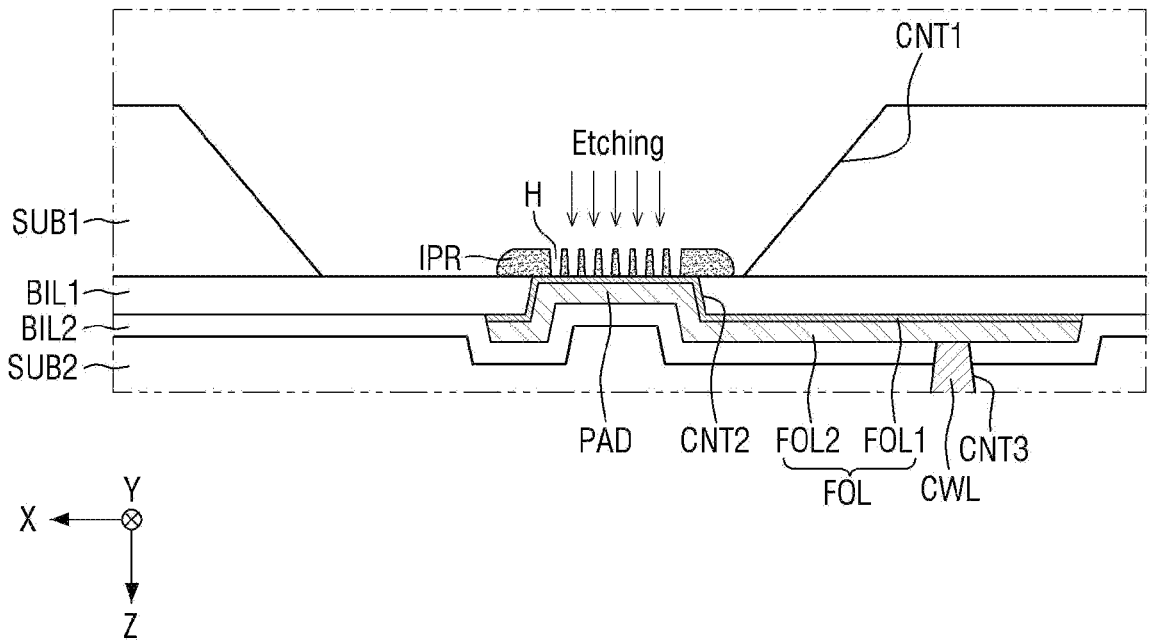

In FIGS. 15 to 17, a stamp STP may be provided for a nanoimprint process. The stamp STP may include protrusions to impress the shape of the imprint resin IPR. The stamp STP may be disposed on the imprint resin IPR and the protrusions of the stamp STP may contact the pad part PAD.

The imprint resin IPR may be cured by ultraviolet (UV) radiation with the stamp STP disposed thereon, and the imprint resin IPR may include a pattern having holes H.

For example, the stamp STP may include the imprint resin IPR. The constituent material of the stramp STP may have a high viscosity or hardness than that of the constituent material of the imprint resin IPR. The stamp STP includes the imprint resin IPR and other materials and thus can be easily separated from the imprint resin IPR after the imprint resin IPR is cured.

Figure 18:
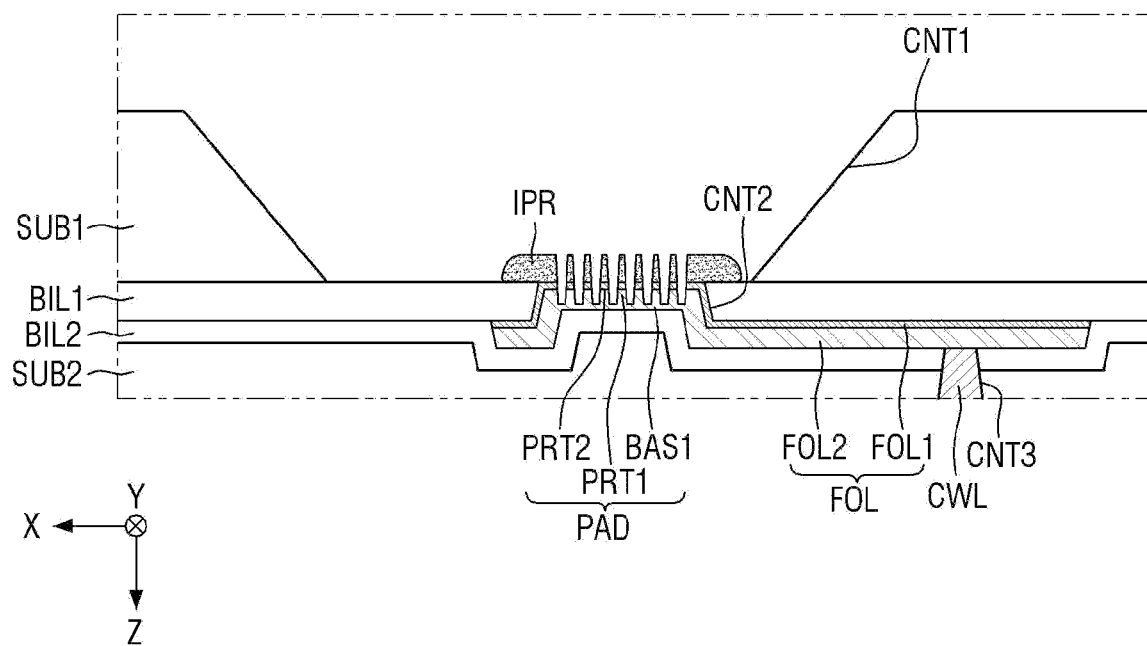

In FIG. 18, the imprint resin IPR may serve as a mask during the patterning process for the pad part PAD. Of the pad part PAD, a portion that is not covered by the imprint resin IPR may be patterned. For example, the pad part PAD may be patterned through a dry etching process, but the disclosure is not limited thereto. The pad part PAD may include the first base BAS1, the first protrusions PRT1, and the second protrusions PRT2 after the patterning process is completed.

Figure 19:
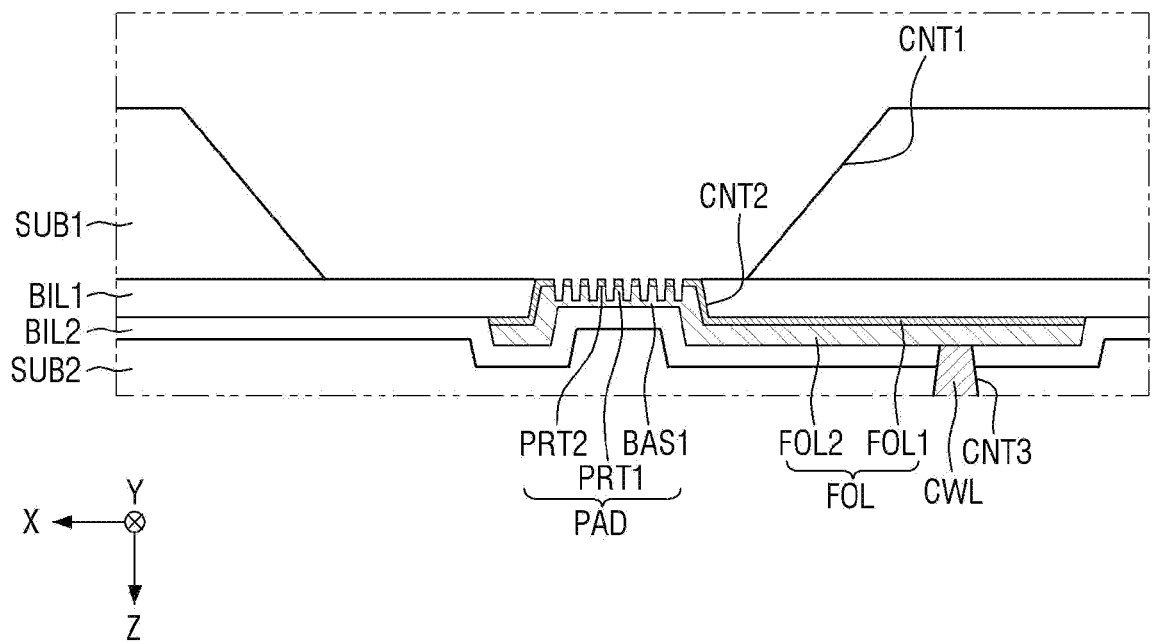

In FIG. 19, the imprint resin IPR may be removed from the pad part PAD. For example, the imprint resin IPR may be removed from the pad part PAD and a surface of the first barrier insulating layer BIL1 through an ashing process, but the disclosure is not limited thereto.

Figure 20:
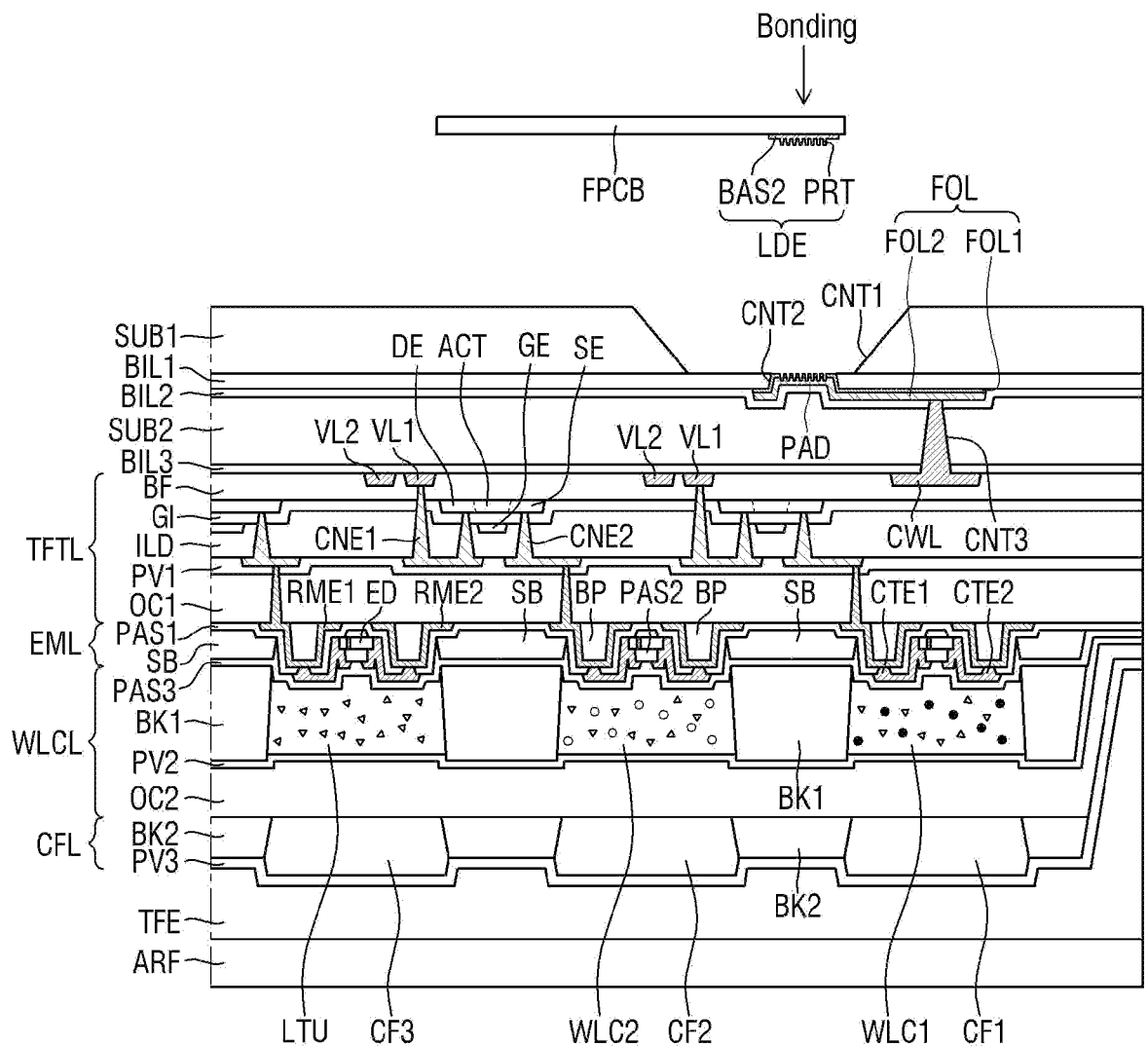
Figure 21:
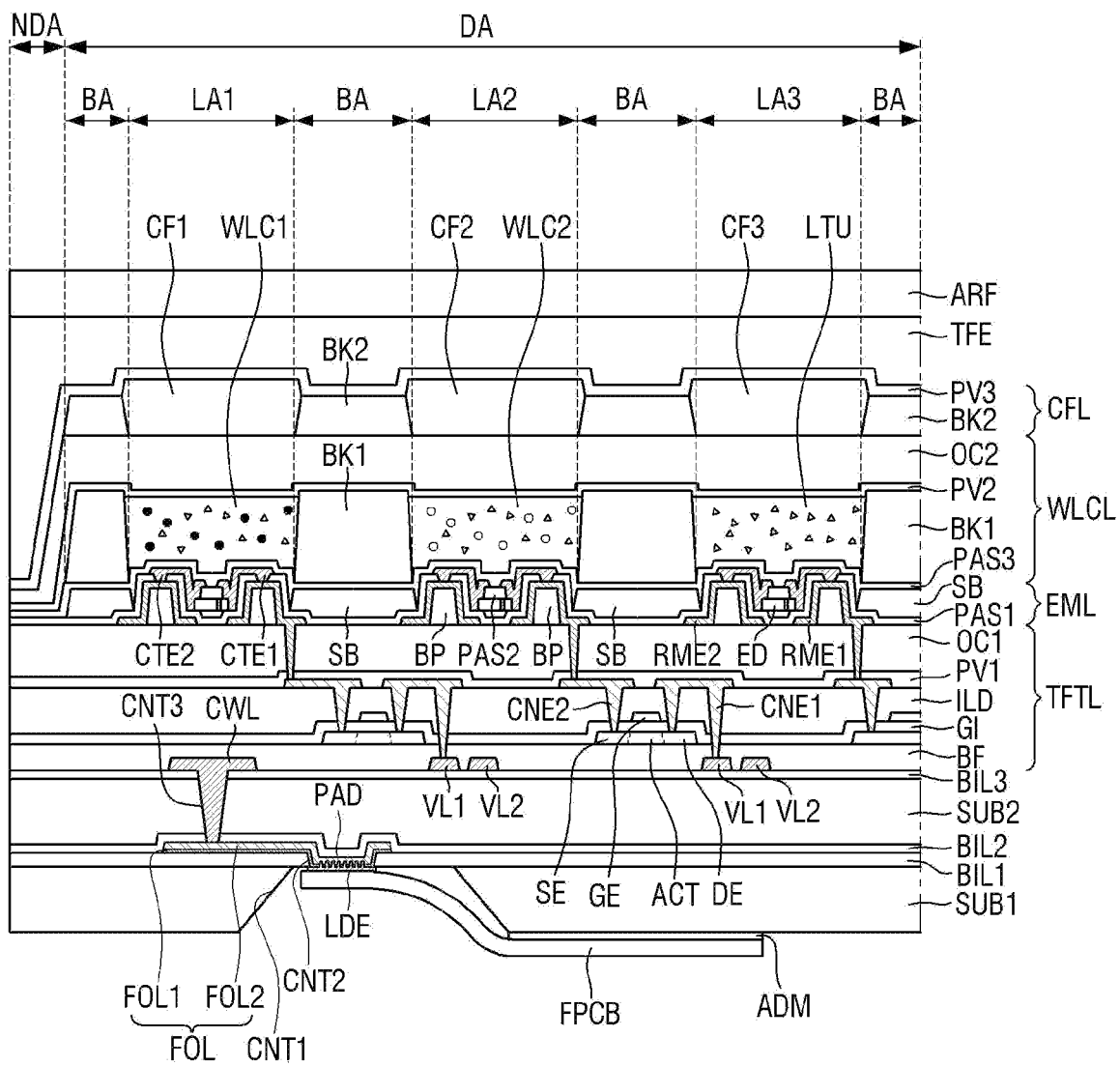

In FIGS. 20 and 21, the flexible film FPCB may be disposed on a surface of the first substrate SUB1. The flexible film FPCB and the lead electrode LDE may be aligned on the pad part PAD through an alignment process. The lead electrode LDE may include the second base BAS2 and the protrusions PRT that correspond to the shapes of the first base BAS1, the first protrusions PRT1 and the second protrusions PRT2. For example, the lead electrode LDE and the pad part PAD may be bonded by metal diffusion via thermocompression bonding or ultrasonic bonding, but the disclosure is not limited thereto.

Optionally, an oxide layer of a surface of each of the lead electrode LDE and the pad part PAD may be removed through plasma treatment before being bonded to each other. Since the oxide layer of the surface of each of the lead electrode LDE and the pad part PAD is removed, metal diffusion strongly occurs so that they can be easily bonded to each other.

The display device 10 includes the first and second protrusions PRT1 and PRT2 of the pad part PAD and the protrusions PRT of the lead electrode LDE, thereby increasing the bonding area of the pad part PAD and the lead electrode LDE. Therefore, the display device 10 may improve the conductivity and bonding strength between the pad part PAD and the lead electrode LDE and may easily transmit the signal and voltage of the flexible film FPCB to the fan-out line FOL.

According to the display device, the method of manufacturing the same, and the tiled display device having the same in accordance with the embodiments, the first and second protrusions of the pad part and the protrusions of the lead electrode are provided so that the bonding area between the pad part and the lead electrode can be increased, the conductivity and bonding strength between the pad part and the lead electrode can be improved, and the signal and voltage of the flexible film can be easily transmitted to the fan-out line.

According to the display device, the method of manufacturing the same, and the tiled display device having the same in accordance with the embodiments, the display driver disposed below the substrate and the connection line on the substrate are electrically connected, thereby reducing the area of the non-display area of the display device. Accordingly, the display device, the method of manufacturing the same, and the tiled display device having the same may prevent a user from recognizing the non-display area NDA between the display devices or the boundary portion between the display devices by reducing the distance between the display devices.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed:

1. A display device comprising:
    a substrate comprising a first contact hole;
    a barrier insulating layer disposed on the substrate and comprising a second contact hole;
    a fan-out line disposed in a first metal layer on the barrier insulating layer and comprising a pad part inserted into the second contact hole;
    a display layer disposed on the fan-out line; and
    a flexible film disposed below the substrate and having a lead electrode which is inserted into the first contact hole and bonded to the pad part,
    wherein the pad part comprises:
        a first base;
        a first protrusion integral with the first base and protruding from the first base; and
        a second protrusion protruding from the first protrusion.

2. The display device of claim 1, wherein the lead electrode comprises:
    a second base; and
    a protrusion integral with the second base and protruding from the second base.

3. The display device of claim 1, wherein
    the first protrusion comprises copper (CU), and
    the second protrusion comprises titanium (Ti).

4. The display device of claim 1, further comprising:
    a display driver mounted on the flexible film to provide a data voltage, a power source voltage, or a gate signal.

5. The display device of claim 1, wherein the display layer comprises:
    a connection line disposed in a second metal layer on the first metal layer; and
    a thin film transistor disposed in an active layer and a third metal layer on the second metal layer.

6. The display device of claim 2, wherein side surfaces of the protrusion of the lead electrode contact a side surface of each of the first and second protrusions of the pad part.

7. The display device of claim 2, wherein
    a lower surface of the second protrusion faces the second base, and
    an upper surface of the protrusion faces the first base.

8. The display device of claim 2, wherein
    the pad part comprises first protrusions,
    the first protrusions extend in a first direction and are spaced apart from each other in a second direction that intersects the first direction, and the protrusion is inserted into a space between the first protrusions.

9. The display device of claim 2, wherein a height of an upper surface of the protrusion is greater than a height of a lower surface of the barrier insulating layer.

10. The display device of claim 5, wherein the flexible film provides a data voltage, a power source voltage, or a gate signal to the thin film transistor through the lead electrode, the pad part, the fan-out line, and the connection line.

11. The display device of claim 5, wherein the display layer further comprises:
    a voltage line disposed in the second metal layer and electrically connected to the thin film transistor; and
    a connection electrode disposed in a fourth metal layer on the third metal layer, and
    one end of the connection electrode is electrically connected to the voltage line, and another end of the connection electrode is electrically connected to the thin film transistor.

12. The display device of claim 11, wherein the display layer further comprises a light emitting element layer disposed on the fourth metal layer, and
    the light emitting element layer comprises:
        a first electrode electrically connected to the connection electrode;
        a second electrode, the second electrode and the first electrode being disposed on a same layer; and
        a light emitting element aligned between the first electrode and the second electrode.

13. A tiled display device comprising:
    a plurality of display devices each of which comprises a display area having a plurality of pixels and a non-display area surrounding the display area; and
    a coupling member that connects the plurality of display devices to each other, wherein
    each of the plurality of display devices comprises:
        a substrate comprising a first contact hole;
        a barrier insulating layer disposed on the substrate and comprising a second contact hole;
        a fan-out line disposed on a first metal layer on the barrier insulating layer and comprising a pad part inserted into the second contact hole;
        a display layer disposed on the fan-out line; and
        a flexible film disposed below the substrate and having a lead electrode which is inserted into the first contact hole and bonded to the pad part,
    wherein the pad part comprises:
        a first base;
        a first protrusion integral with the first base and protruding from the first base; and
        a second protrusion protruding from the first protrusion.

* * * * *